(12) United States Patent
Fischer et al.

(10) Patent No.: US 8,689,169 B2
(45) Date of Patent: Apr. 1, 2014

(54) METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS

(75) Inventors: Ed Fischer, Salem, OR (US); David White, San Jose, CA (US); Michael McSherry, Portland, OR (US); Bruce Yanagida, Snohomish, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 235 days.

(21) Appl. No.: 12/982,628

(22) Filed: Dec. 30, 2010

(65) Prior Publication Data

US 2012/0023472 A1 Jan. 26, 2012

Related U.S. Application Data

(60) Provisional application No. 61/367,398, filed on Jul. 24, 2010, provisional application No. 61/367,412, filed on Jul. 24, 2010, provisional application No. 61/367,404, filed on Jul. 24, 2010, provisional application No. 61/367,406, filed on Jul. 24, 2010, provisional application No. 61/367,407, filed on Jul. 24, 2010, provisional application No. 61/367,410, filed on Jul. 24, 2010.

(51) Int. Cl.
*G06F 17/50* (2006.01)

(52) U.S. Cl.
USPC ........... 716/139; 716/100; 716/110; 716/111; 716/112; 716/136

(58) Field of Classification Search
USPC .......................... 716/100, 110–112, 136, 139
See application file for complete search history.

(56) References Cited

U.S. PATENT DOCUMENTS

| | | | | |
|---|---|---|---|---|
| 4,817,012 A | * | 3/1989 | Cali' | 716/115 |
| 5,469,366 A | | 11/1995 | Yang et al. | |
| 5,553,002 A | | 9/1996 | Dangelo et al. | |
| 5,629,857 A | * | 5/1997 | Brennan | 716/139 |
| 5,872,952 A | | 2/1999 | Tuan et al. | |
| 5,999,726 A | * | 12/1999 | Ho | 716/112 |

(Continued)

OTHER PUBLICATIONS

International Search Report and Written Opinion dated Sep. 16, 2011 for PCT App. No. PCT/US11/45119.

(Continued)

*Primary Examiner* — Stacy Whitmore
(74) *Attorney, Agent, or Firm* — Vista IP Law Group, LLP

(57) ABSTRACT

Disclosed are a method, system, and computer program product for providing customizable information in designing electronic circuits with electrical awareness. The method or the system displays a portion of a physical design of an electronic circuit in a first display area. The method or the system receives or identifies a user's or a system's manipulation of the portion of the physical design of the electronic circuit. The method or the system then determines and displays an in situ response to the manipulation in the first display area. The method or the system may further display, in the first display area or in another display area, result(s) relating to the physical data of a component, electrical parasitic(s) associated with the physical data, electrical characteristic(s) associated with the physical data or the electrical characteristic(s), or other element(s) of the physical design that is impacted by the manipulation.

26 Claims, 30 Drawing Sheets

(56) References Cited

U.S. PATENT DOCUMENTS

| | | | |
|---|---|---|---|
| 6,072,945 A | 6/2000 | Aji et al. | |
| 6,131,182 A | 10/2000 | Beakes et al. | |
| 6,378,110 B1 * | 4/2002 | Ho | 716/112 |
| 6,438,729 B1 | 8/2002 | Ho | |
| 6,449,578 B1 | 9/2002 | McBride | |
| 6,470,482 B1 | 10/2002 | Rostoker et al. | |
| 6,507,932 B1 | 1/2003 | Landry et al. | |
| 6,523,150 B1 | 2/2003 | Buffet et al. | |
| 6,539,533 B1 * | 3/2003 | Brown et al. | 716/112 |
| 6,553,554 B1 * | 4/2003 | Dahl et al. | 716/119 |
| 6,584,606 B1 | 6/2003 | Chiu et al. | |
| 6,643,836 B2 * | 11/2003 | Wheeler et al. | 716/102 |
| 6,665,845 B1 | 12/2003 | Aingaran et al. | |
| 6,701,508 B1 * | 3/2004 | Bartz et al. | 716/139 |
| 6,842,714 B1 | 1/2005 | Acar et al. | |
| 6,877,148 B1 | 4/2005 | Hassibi et al. | |
| 6,910,200 B1 * | 6/2005 | Aubel et al. | 716/102 |
| 6,954,915 B2 | 10/2005 | Batchelor | |
| 6,971,074 B2 * | 11/2005 | Hasegawa et al. | 716/120 |
| 6,981,238 B1 | 12/2005 | Churchill | |
| 7,016,794 B2 | 3/2006 | Schultz | |
| 7,020,853 B2 | 3/2006 | Skoll et al. | |
| 7,069,526 B2 * | 6/2006 | Schubert et al. | 716/102 |
| 7,076,410 B1 * | 7/2006 | Kerzman et al. | 703/6 |
| 7,089,129 B2 * | 8/2006 | Habitz | 702/65 |
| 7,152,215 B2 * | 12/2006 | Smith et al. | 716/52 |
| 7,159,202 B2 | 1/2007 | Lee et al. | |
| 7,178,118 B2 | 2/2007 | Ramachandran et al. | |
| 7,181,383 B1 | 2/2007 | McGaughy et al. | |
| 7,228,514 B2 | 6/2007 | Chan et al. | |
| 7,243,317 B2 | 7/2007 | Wang et al. | |
| 7,251,800 B2 | 7/2007 | McElvain et al. | |
| 7,278,120 B2 | 10/2007 | Rahmat et al. | |
| 7,331,029 B2 | 2/2008 | Amit et al. | |
| 7,347,621 B2 * | 3/2008 | Sri-Jayantha et al. | 374/166 |
| 7,356,784 B1 | 4/2008 | Dengi et al. | |
| 7,383,521 B2 | 6/2008 | Smith et al. | |
| 7,395,519 B2 * | 7/2008 | Kawata | 716/112 |
| 7,559,045 B2 | 7/2009 | Chen et al. | |
| 7,567,894 B2 * | 7/2009 | Durand et al. | 703/28 |
| 7,574,682 B2 * | 8/2009 | Riviere-Cazaux | 716/136 |
| 7,596,771 B2 | 9/2009 | Cohen et al. | |
| 7,640,527 B1 | 12/2009 | Doraira et al. | |
| 7,797,646 B2 * | 9/2010 | Chung et al. | 716/113 |
| 7,802,222 B2 * | 9/2010 | Arsintescu | 716/122 |
| 7,805,698 B1 * | 9/2010 | Ferguson et al. | 716/103 |
| 7,810,063 B1 * | 10/2010 | Sharma et al. | 716/139 |
| 7,818,697 B2 * | 10/2010 | Cho | 716/136 |
| 7,904,852 B1 | 3/2011 | Cadouri et al. | |
| 7,941,768 B1 * | 5/2011 | Wei | 716/54 |
| 7,966,588 B1 | 6/2011 | Perry et al. | |
| 8,141,013 B2 | 3/2012 | Woods et al. | |
| 8,150,638 B1 | 4/2012 | Wu et al. | |
| 8,185,856 B2 | 5/2012 | Izuha | |
| 8,224,636 B2 | 7/2012 | Kundert | |
| 8,261,228 B1 | 9/2012 | Gopalakrishnan et al. | |
| 2002/0166102 A1 * | 11/2002 | Du et al. | 716/11 |
| 2003/0131323 A1 * | 7/2003 | McConaghy | 716/2 |
| 2004/0049747 A1 | 3/2004 | Yamasaki et al. | |
| 2004/0078767 A1 | 4/2004 | Burks et al. | |
| 2004/0117748 A1 * | 6/2004 | Tester | 716/11 |
| 2004/0117750 A1 * | 6/2004 | Skoll et al. | 716/11 |
| 2004/0128368 A1 * | 7/2004 | Sakai | 709/220 |
| 2004/0128638 A1 | 7/2004 | Kerzman et al. | |
| 2004/0143809 A1 | 7/2004 | Cowan et al. | |
| 2004/0243949 A1 | 12/2004 | Wang et al. | |
| 2005/0010922 A1 | 1/2005 | Czajkowski et al. | |
| 2005/0114818 A1 * | 5/2005 | Khakzadi et al. | 716/11 |
| 2005/0216873 A1 | 9/2005 | Singh et al. | |
| 2005/0268258 A1 * | 12/2005 | Decker | 716/4 |
| 2005/0268269 A1 * | 12/2005 | Coiley | 716/11 |
| 2005/0273732 A1 | 12/2005 | Xu et al. | |
| 2005/0278665 A1 | 12/2005 | Gentry et al. | |
| 2006/0095884 A1 * | 5/2006 | Skoll et al. | 716/11 |
| 2006/0095889 A1 | 5/2006 | Cote et al. | |
| 2006/0101368 A1 * | 5/2006 | Kesarwani et al. | 716/11 |
| 2006/0123364 A1 | 6/2006 | Cook et al. | |
| 2007/0094622 A1 | 4/2007 | Lee et al. | |
| 2007/0106969 A1 | 5/2007 | Birch et al. | |
| 2007/0118827 A1 | 5/2007 | Rahman | |
| 2007/0234266 A1 | 10/2007 | Chen et al. | |
| 2007/0245274 A1 | 10/2007 | Kimura | |
| 2007/0299647 A1 | 12/2007 | Bolcato et al. | |
| 2008/0022251 A1 | 1/2008 | McConaghy et al. | |
| 2008/0133201 A1 | 6/2008 | Guedon | |
| 2008/0148195 A1 | 6/2008 | Chan et al. | |
| 2008/0209365 A1 * | 8/2008 | Riviere-Cazaux | 716/4 |
| 2008/0244497 A1 * | 10/2008 | Zhao et al. | 716/14 |
| 2008/0244498 A1 * | 10/2008 | Gupta et al. | 716/15 |
| 2009/0019411 A1 | 1/2009 | Chandra et al. | |
| 2009/0031261 A1 | 1/2009 | Smith et al. | |
| 2009/0089733 A1 | 4/2009 | Chang et al. | |
| 2009/0144042 A1 | 6/2009 | Lorenz et al. | |
| 2009/0150842 A1 | 6/2009 | Kemerer et al. | |
| 2009/0254874 A1 | 10/2009 | Bose | |
| 2009/0265672 A1 | 10/2009 | St. John et al. | |
| 2010/0083200 A1 | 4/2010 | Song et al. | |
| 2010/0217577 A1 | 8/2010 | Korobkov et al. | |
| 2011/0107293 A1 * | 5/2011 | Ganzhorn et al. | 716/139 |
| 2011/0197170 A1 | 8/2011 | Chandramohan et al. | |
| 2011/0314437 A1 * | 12/2011 | McIlrath | 716/139 |
| 2012/0022846 A1 | 1/2012 | White et al. | |
| 2012/0023465 A1 | 1/2012 | Gopalakrishnan et al. | |
| 2012/0023467 A1 | 1/2012 | McSherry et al. | |
| 2012/0117530 A1 * | 5/2012 | Green | 716/139 |

OTHER PUBLICATIONS

International Search Report and Written Opinion dated Sep. 16, 2011 for PCT App. No. PCT/US11/45110.
International Search Report and Written Opinion dated Sep. 22, 2011 for PCT App. No. PCT/US11/45126.
International Search Report and Written Opinion dated Sep. 22, 2011 for PCT App. No. PCT/US11/45123.
International Search Report and Written Opinion dated Dec. 9, 2011 for PCT App. No. PCT/US11/45104.
International Search Report and Written Opinion dated Dec. 7, 2011 for PCT App. No. PCT/US11/45091.
Non-Final Office Action dated Sep. 14, 2012 for U.S. Appl. No. 13/189,274.
Non-Final Office Action dated Jun. 15, 2012 for U.S. Appl. No. 12/982,822.
Final Office Action dated Nov. 13, 2012 for U.S. Appl. No. 12/982,822.
Non-Final Office Action dated Oct. 3, 2012 for U.S. Appl. No. 12/982,732.
Notice of Allowance dated Jan. 7, 2013 for U.S. Appl. No. 13/189,274.
Non-Final Office Action dated Jan. 18, 2013 for U.S. Appl. No. 12/982,790.
T. Quarles, "SPICE3 Version 3f3 User's Manual", May 1993.
Final Office Action dated Apr. 4, 2013 for U.S. Appl. No. 12/982,721.
Non-Final Office Action dated Jun. 24, 2013 for U.S. Appl. No. 12/982,762.
Non-Final Office Action dated Aug. 6, 2013 for U.S. Appl. No. 12/982,732.
Non-Final Office Action dated Aug. 20, 2013 for U.S. Appl. No. 13/189,274.
Final Office Action dated Feb. 19, 2013 for U.S. Appl. No. 12/982,732.
Final Office Action dated May 2, 2013 for U.S. Appl. No. 12/982,790.
Final Office Action dated Dec. 17, 2013 for U.S. Appl. No. 12/982,762.
Notice of Allowance dated Dec. 4, 2013 for U.S. Appl. No. 13/189,274.
Notice of Allowance dated Dec. 9, 2013 for U.S. Appl. No. 12/982,732.

* cited by examiner

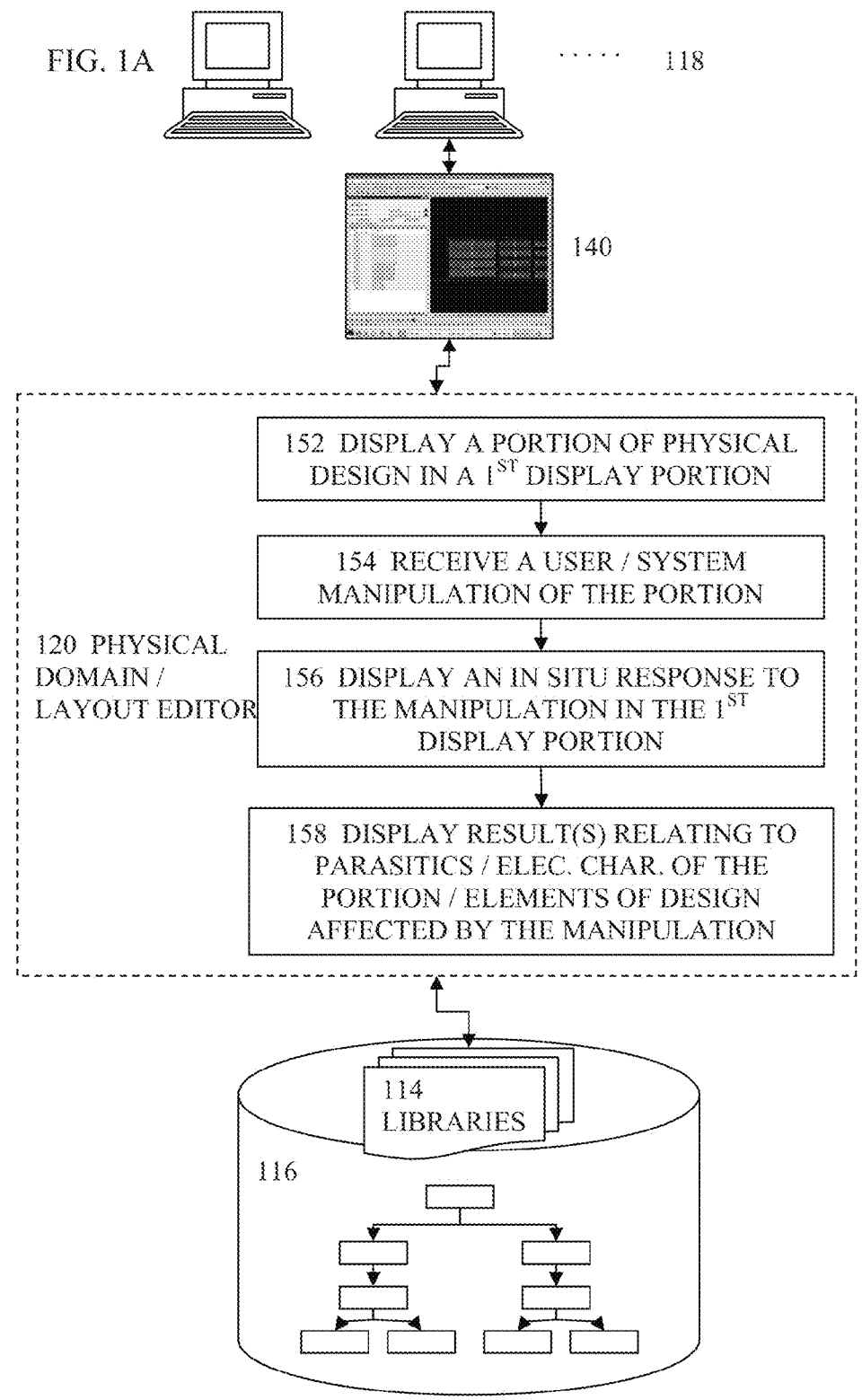

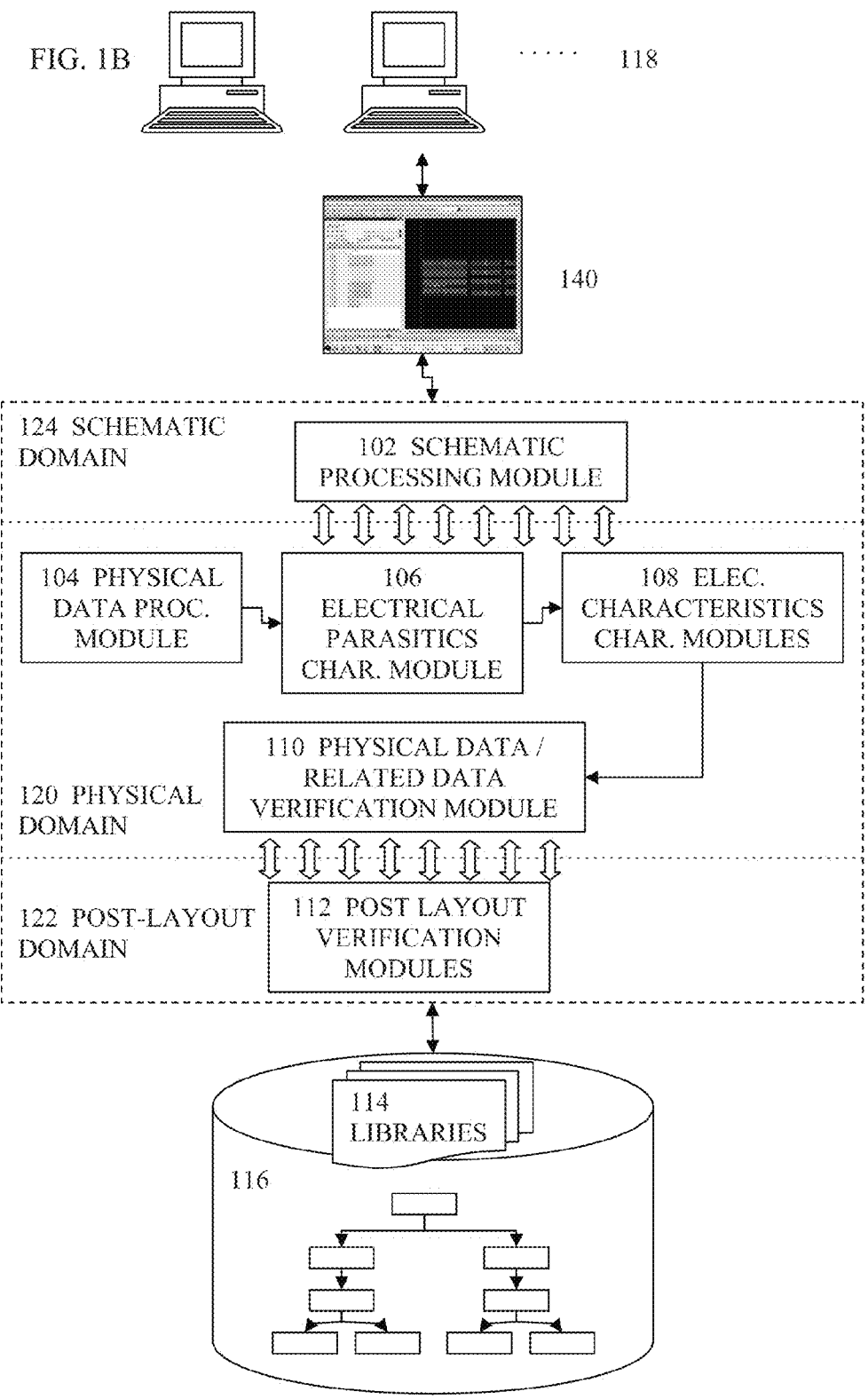

| 302 GUI MENU ITEMS |

| 304 EAD DESIGN BROWSER<br>- PHYSICAL DESIGN DISPLAY PORTION CONTENT CONTROL<br>- DESIGN EDITING FUNCTIONS<br>- COLLAPSIBLE PHYSICAL ELEMENT TREES NAVIGATOR<br>- PARASITIC(S), ELEC. CHAR., & OTHER DATA ASSOCIATED WITH PHYSICAL ELEMENT(S) / TREE(S)<br>- CONSTRAINT(S) & COMPLIANCE CHECK RESULT(S) WITH LEGENDS & DESCRIPTION<br>- LEGEND CONTROL | 306 PHYSICAL DESIGN DISPLAY PORTION<br><br>- IN-SITU RESPONSE(S) TO USER / SYSTEM MANIPULATION(S)<br>- RESULT(S) RELATING TO PARASITIC(S) OR ELEC. CHARACTERISTIC(S) IN RESPONSE TO USER / SYSTEM MANIPULATION(S) OF A PORTION OF THE PHYSICAL DESIGN OR OTHER ELEMENT(S) IMPACTED BY MANIPULATION(S) |

| 308 UI FOR HINT(S) / SUGGESTION(S) FOR CONSTRAINT(S) & COMPLIANCE CHECK RESULT(S) OR UI FOR ASSISTED FIX(ES) / WHAT-IF ANALYSES |

FIG. 3

METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS

CROSS-REFERENCE TO RELATED APPLICATION(S)

This application claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", and U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned applications are hereby expressly incorporated by reference in their entirety.

This Application is related to U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS" and filed concurrently under, U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" and filed concurrently under, U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS" and filed concurrently under, and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS" and filed concurrently under. The entire disclosures of the above applications are hereby expressly incorporated by reference in their entireties in the instant Application.

BACKGROUND

Conventional electronic circuit design tool set generally comprises some schematic level tools, such as the schematic editor, one or more simulators, etc., and some physical level tools, such as the layout editor, the physical verification tool(s), one or more physical level simulators, etc. These tools may have their own user interfaces such as graphical user interfaces (GUI). A designer often needs to go back and forth among a few user interfaces to obtain the desired or necessary information or data while implementing an electronic circuit design. For example, a designer may need to use a physical verification tool to perform some verifications of an electronic circuit layout and then return to a layout tool to observe or manipulate the layout in order to see if the layout passes the verification.

Thus, there exists a need for providing in situ, customizable information in designing electronic circuits with electrical awareness.

SUMMARY

Disclosed comprises a method, a system, and a computer program product for providing customizable information in designing electronic circuits with electrical awareness. In a single embodiment or in some embodiments, the method or the system for providing customizable information in designing electronic circuits with electrical awareness comprises the process or module for displaying a portion of a physical design in a first display portion of a user interface. The method or the system may further comprise the process or module for receiving a manipulation of the portion of the physical design, wherein the manipulation may be effected by a user/designer or from any tools in the electronic circuit design tool set.

In a single embodiment or in some embodiments, the method or the system may further comprise the process or module for displaying a response generated by a tool in the electronic circuit design tool set in response to the manipulation in the first display portion of the user interface. The method or the system may also comprise the process or module for displaying, in either the first display portion of the user interface or another portion of the user interface, one or more results relating to parasitic(s), electrical characteristic(s), or physical data of the portion of the electronic circuit design or any other elements of the electronic circuit design that are affected by the manipulation in a single embodiment or in some embodiments. In some embodiments, the user interface comprises a graphical user interface of a physical domain electronic circuit design tool.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 1A-C illustrate top level system diagrams for implementing various embodiments of the methods or systems for providing customizable information in designing electronic circuits with electrical awareness.

FIG. 3 illustrates more details about some items in the user interface for providing customizable information in designing electronic circuits with electrical awareness in some embodiments.

DETAIL DESCRIPTION

Figure 1C:
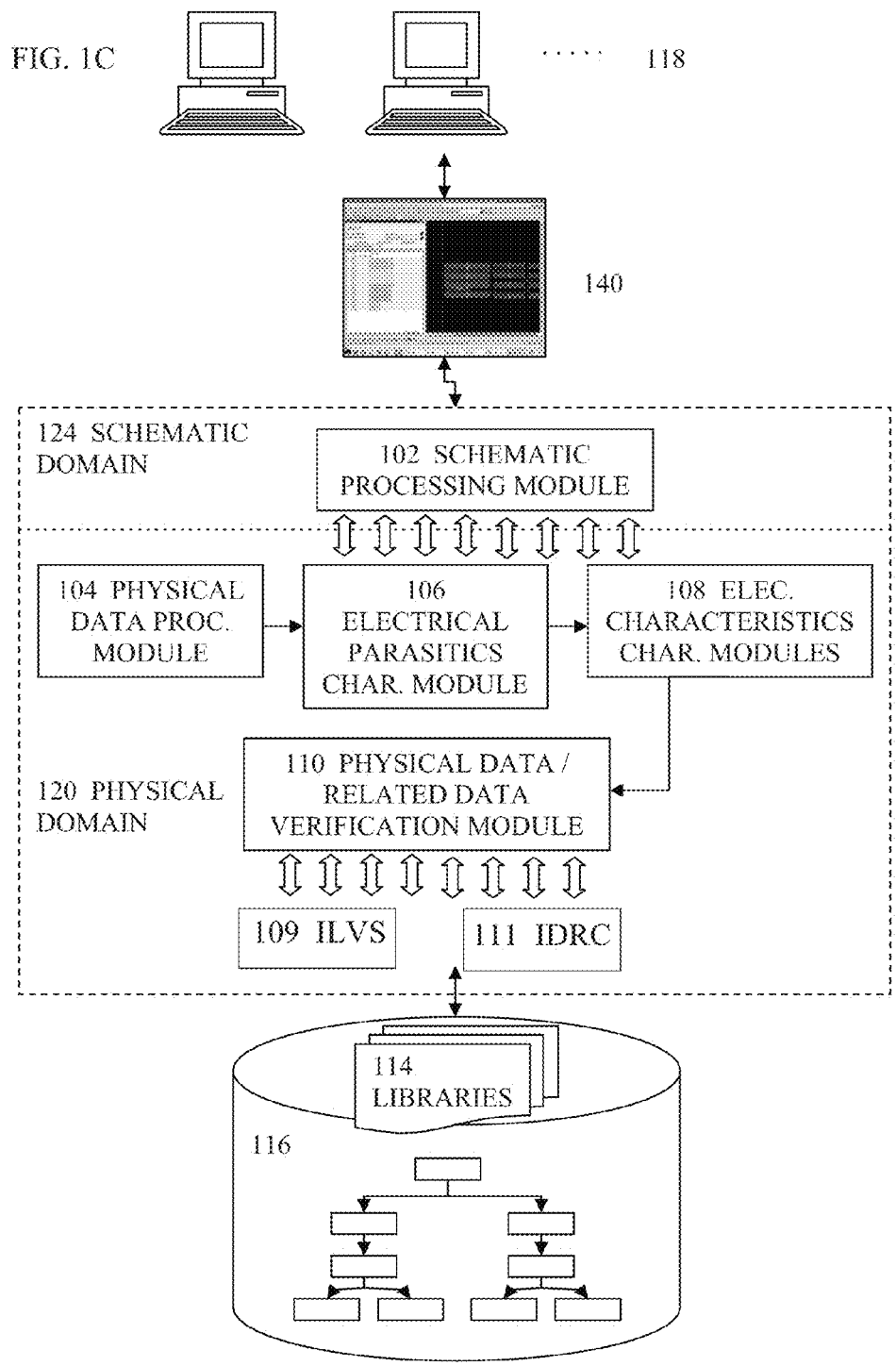

Various embodiments of the invention are directed to a methods, systems, and articles of manufacture for providing in situ, customizable information in designing electronic circuits with electrical awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of various embodiments of the invention. Where certain elements of some embodiments of the invention may be partially or fully implemented using known components (or methods or processes), only those portions of such known components (or methods or processes) that are necessary or desired for an understanding of the present invention will be described, and the detailed descriptions of other portions of such known components (or methods or processes) will be omitted so as not to obscure the invention. Further, various embodiments of the invention encompasses present and future known equivalents to the components referred to herein by way of illustration.

Referring to FIG. 1A which illustrates a top level system diagram for implementing various embodiments of the methods or systems for providing customizable information in designing electronic circuits with electrical awareness, the system comprises one or more user terminals or computing nodes 118 which interfaces with one or more physical domain electronic circuit design tools 120 via at least one user interface 140. The one or more physical domain electronic circuit design tools 120 further interact with a storage system, device, or medium 116 that stores various information or data such as flat or hierarchical electronic circuit designs at various abstraction levels, libraries 114, various analysis results or data, etc.

In a single embodiment or in some embodiments, the one or more physical domain tools comprises a module for displaying a portion of a physical design in a first display portion 152. The one or more physical domain tools may further comprise a module 154 for receiving a manipulation on the portion of the electronic circuit design in some embodiments and a module 156 for displaying a response of at least one of the tools in an electronic circuit design tool set, which comprises the one or more physical domain tools, in response to the manipulation. In some embodiments, the manipulation comprises a manipulation from a user/designer or from one or more tools in the electronic circuit design tool set on the portion of the electronic circuit. In some embodiments, the electronic circuit design tool set comprises one or more schematic level tools such as a schematic editor or one or more schematic level simulators.

Figure 4:
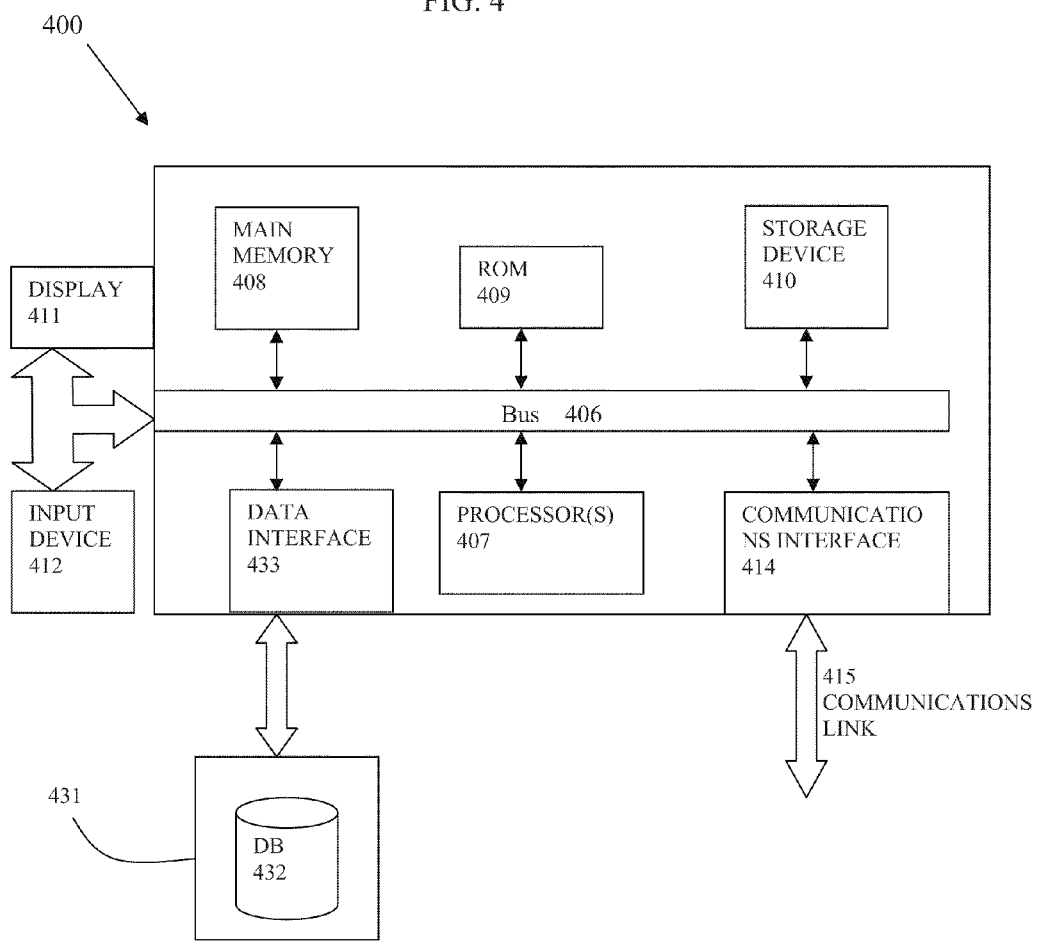
FIG. 4 illustrates a computerized system on which a method for timing closure with concurrent process models can be implemented.

It shall be noted that the modules any of the modules 152, 154, 156, and 158 may be implemented in hardware circuitry, software, or a combination thereof. In some embodiments where one of the modules is implemented as software, the software is to interact with some or all of the components in a computing system as illustrated in FIG. 4 to perform its intended functions.

Referring to FIG. 1B which illustrate a top level system diagram for implementing various embodiments of the methods or systems for providing customizable information in designing electronic circuits with electrical awareness, the system comprises one or more user terminals or computing nodes 118 which interfaces with one or more schematic processing module 102 in the schematic domain 124 and one or more physical domain electronic circuit design tools in the physical domain 120 via at least one user interface 140. In some embodiments, the schematic processing module may comprise, for example, a schematic editor or a schematic simulator. In one or more embodiments, The one or more physical domain electronic circuit design tools 120 further interact with a storage system, device, or medium 116 that stores various information or data such as flat or hierarchical electronic circuit designs at various abstraction levels, libraries 114, various analysis results or data, etc.

In some embodiments, the one or more physical domain electronic circuit design tools 120 may further interact with a post layout verification modules 112 which comprises, for example, a design rule checking (DRC) tool, a physical verification tool, etc. in a post-layout domain 122 in which these post-layout domain tools perform their intended functions with a complete layout of an electronic circuit.

In some embodiments shown in FIG. 1C, the functions provided by the post layout verification modules are built directly into the interactive infrastructure. In this mode, the binder that synchronizes the schematic and layout in as each physical design object is added is incrementally performing LVS 109 (Layout Versus Schematic) such that the post verification LVS is not required. Similarly, in this mode design rule checking (DRC) can be done incrementally 111 (IDRC) as physical design objects are created. In this embodiment, the completed layout meets design and manufacturability rules required for verification.

The one or more physical domain electronic circuit design tools 120 may comprise, for example, a physical data processing module 104 that is configured with hardware circuitry, software, or a combination thereof or is programmed for performing identifying, determining, or updating physical data of a net, a device, or a component of a complete or incomplete physical design of the electronic circuit.

The one or more physical domain electronic circuit design tools 120 may also comprise an electrical parasitics characterization module 106 that is configured with hardware circuitry, software, or a combination thereof or is programmed for performing characterizing one or more electrical parasitics that are associated with the physical data.

The one or more physical domain electronic circuit design tools 120 may also comprise an electrical characteristics characterization module 108 that is configured with hardware circuitry, software, or a combination thereof or is programmed for performing characterizing one or more electrical characteristics that are associated with the one or more electrical parasitics and the physical data.

The one or more physical domain electronic circuit design tools 120 may also comprise a physical data or related data verification module 110 that is configured with hardware circuitry, software, or a combination thereof or is programmed for performing various verification on the one or more parasitics, the one or more electrical characteristics, or the physical data. More details about the module 104, 106, 108, and 110 are described in related U.S. patent application Ser. No. 12/982,721, entitled "METHODS, SYSTEMS, AND ARTICLES OF MANUFACTURES FOR IMPLEMENTING ELECTRONIC CIRCUIT DESIGNS WITH ELECTRICAL AWARENESS" and filed concurrently under, U.S. patent application Ser. No. 12/982,790, entitled "METHODS, SYSTEMS, AND ARTICLES OF MANUFACTURES FOR IMPLEMENTING ELECTRONIC CIRCUIT DESIGNS WITH SIMULATION AWARENESS" and filed concurrently under, U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under, and U.S. patent application Ser. No. 12/982,732, entitled "METHODS, SYSTEMS, AND ARTICLES OF MANUFACTURES FOR CONSTRAINT VERIFICATION FOR IMPLEMENTING ELECTRONIC CIRCUIT DESIGNS WITH ELECTRICAL AWARENESS" and filed concurrently under, the contents of all the aforementioned applications are hereby incorporated by reference in their entirety.

It shall be noted that the modules any of the modules 102, 104, 106, 108, 110, and 112, may be implemented in hardware circuitry, software, or a combination thereof. In some embodiments where one of the modules is implemented as software, the software is to interact with some or all of the components in a computing system as illustrated in FIG. 4 to perform its intended functions.

Figure 2:
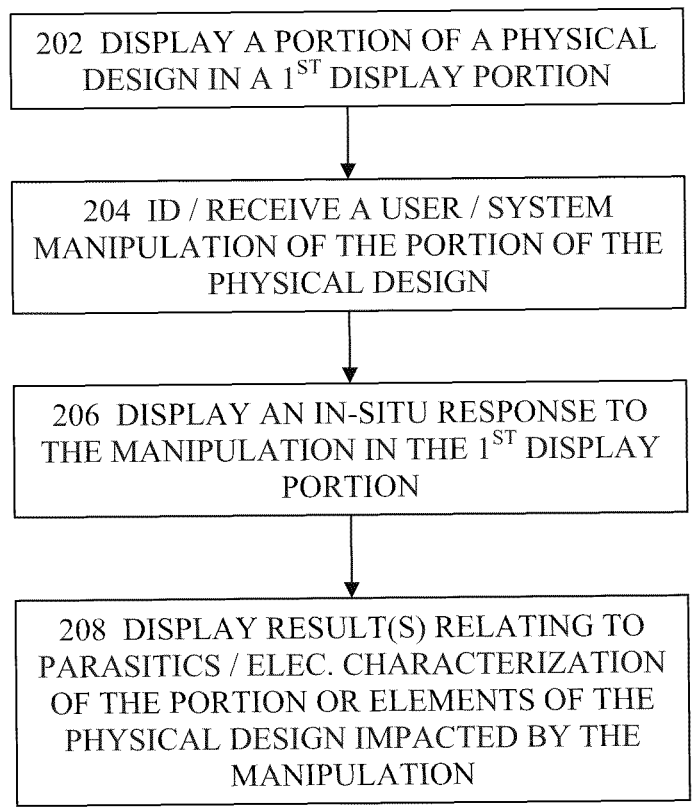
FIG. 2 illustrates a top level diagram for the method or system for providing customizable information in designing electronic circuits with electrical awareness.

Referring to FIG. 2 which illustrates a top level diagram for the method or system for providing customizable information in designing electronic circuits with electrical awareness, the method or the system may comprise a process or a module 202 for displaying a portion of a physical design in a first display portion of a user interface in a single embodiment or in some embodiments. In some embodiments, the user interface comprises a graphical user interface of a physical domain electronic circuit design tool. An example of a physical domain electronic circuit design tool comprises a electronic layout editor in some embodiments.

The method or the system may further comprise a process or module 204 for identifying or receiving a manipulation of the portion of the physical design in a single embodiment or in some embodiments. In some embodiments, the manipulation may be effected by a user/designer or by any tool in the electronic circuit design tool set which may comprise, for example, some schematic domain tools, some physical domain tools such as a router, or some post-layout tools that require a complete layout instead of a partial layout of an electronic circuit design. Some examples of the post-layout tools comprise, for example but not limited to, an LVS tool, a physical/formal verification tool, a post-layout optimization tool, or a sign-off tool in some embodiments.

The manipulation may comprise, for example, a user's identification of an area of interest in the physical design by using the user interface or a pointing device, a change in the physical data, electrical characteristic(s), or other related items in the electronic circuit design, a click on or moving a cursor over an entity, a menu item, a net, a device, or a component (hereinafter component), or any other items in the entire display area, or any commands or instructions associated with the physical design. It shall be noted that a manipulation may also refers to any operations performed or to be performed, either automatically by the system or assisted by a user, in one or more electronic circuit design tools.

In a single embodiment or in some embodiments, the method or system may further comprise a process or module 206 for displaying a response to the manipulation of the portion of the electronic circuit design in the first display portion in which the portion of the physical design is also displayed. In some embodiments, the response may be overlaid on top of the portion of the physical design in the first display portion. In some embodiments, the response may be implemented as a pop-up window in the first display portion or other portions of the user interface. In some embodiments, the display of the response to the manipulation comprises an in situ response to the manipulation. In these embodiments, the display of the response to the manipulation occurs without generally interrupting the state of various electronic circuit design tools by, for example, leaving one tool for another tool in order to generate or cause to generate the response. In some embodiments, the display of the response to the manipulation occurs substantially in real-time. Nonetheless, it shall be noted that the manipulation may trigger one or more processes or may invoke one or more modules to perform various functions in order to generate the response to the manipulation, and that the triggering of the one or more processes or the invocation of various modules may take certain time to complete. As a result, the display of the response occurs substantially in real-time.

In a single embodiment or in some embodiments, the method or system may further comprise a process or module 208 for displaying one or more result(s) relating to the physical data of a net, a device, or a component of the portion of the physical design, electrical parasitic(s) associated with the physical data, electrical characteristic(s), electrical characteristic(s) associated with the physical data or the electrical parasitic(s), or other elements of the physical design that are impacted by the manipulation.

FIG. 3 illustrates more details about some items in the user interface for providing customizable information in designing electronic circuits with electrical awareness in some embodiments. In some embodiments, FIG. 3 illustrates some of the components of a user interface. For example, the user interface as illustrated in FIG. 3 may comprise GUI menu items 302, a first display portion 306 of the physical design display area, a second display area or portion (collectively portion) 304 for the EAD (electrically aware design) browser, or an interface or a third display portion 308 for displaying various hints, suggestions, or recommendations for one or more constraint verification result(s) or compliance check result(s) or for automatic or assisted fixes or what-if analyses.

In some embodiments, the user interface comprises a physical design display portion content control which may be used to control or customize how various information or data may be displayed in the physical design display portion 306. For example, the physical design display portion content control may be used to select whether certain layers, nets, components, hierarchical levels, physical data, electrical characteristics, electrical parasitics, other data associated with the physical design, etc. of the physical design are to be displayed, the appearance of the display for various entities such as what colors are to be used to display various information or data in the physical design display portion, etc. in some embodiments.

In some embodiments, the user interface provides one of more interactive design editing functions to a user. In some embodiments, the user interface comprises a navigator for a user to navigate through one or more trees of elements associated with various nets, devices, or components (hereinafter component) of the physical design or a portion thereof. For example, the navigator may provide individual component information or data for a given portion of the physical design in a collapsible tree with multiple branches, each of which may comprise one or more collapsible levels of data or information to be displayed. In some embodiments, the user interface comprises a display of physical data, electrical parasitics associated with the physical data, electrical characteristics associated with the physical data or the electrical parasitics, or other related data of the physical design or a portion thereof.

In some embodiments, the user interface comprises a display of one or more results of physical, parasitic, or electrical constraint verification or compliance check. In some embodiments, such a display of one or more results may also comprise using a customizable thermal map for various results. For example, any violation of a constraint or design rule may be shown in a first color, a first line type, or a first shape texture; any components whose parasitics, physical data, electrical characteristics, or other data are at a level that does not rise to the level of violation but may cause concerns or other issues may be displayed in a second color, a second line type, or a second shape texture; any components that meet various constraints, design rules, or requirements may be displayed in a third color, a third line type, or a third shape texture. In some embodiments, the user interface further displays legends for the display so a user may understand what information the thermal display conveys. In some embodiments, the thermal maps may be customized in a way such that a user may easily spot areas of concerns in the physical display portion. For example, a user may customize the thermal map display to use the color red for any violations of constraints or hard design rules that have to be fulfilled and to use white for the remaining physical design. In this example, a user may easily spot the violations in red in the physical design display portion.

In some embodiments, the physical design display portion may be configured to provide in situ and/or real-time responses to manipulations that are effected from a user, one or more electronic circuit design tools, or a combination thereof. The physical design display portion may also be configured to display one or more results relating to the characterizations of electrical parasitic(s) or electrical characteristic(s) of a particular component of interest in response to the manipulations of this particular component of interest in some embodiments. The physical design display portion may further be configured to display one or more results relating to the characterizations of electrical parasitic(s) or electrical characteristic(s) of other elements of the physical design that are impacted by the manipulations of the particular component.

FIG. 4 illustrates a block diagram of an illustrative computing system 400 suitable for implementing some embodiments of the method or system for providing in situ, customizable information in designing electronic circuits with electrical awareness as described in the preceding paragraphs with reference to various figures. Computer system 400 includes a bus 406 or other communication mechanism for communicating information, which interconnects subsystems and devices, such as processor 407, system memory 408 (e.g., RAM), static storage device 409 (e.g., ROM), disk drive 410 (e.g., magnetic or optical), communication interface 414 (e.g., modem or Ethernet card), display 411 (e.g., CRT or LCD), input device 412 (e.g., keyboard), and cursor control (not shown).

According to one embodiment, computer system 400 performs specific operations by one or more processor or processor cores 407 executing one or more sequences of one or more instructions contained in system memory 408. Such instructions may be read into system memory 408 from another computer readable/usable storage medium, such as static storage device 409 or disk drive 410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 407 for execution. Such a medium may take many forms, including but not limited to, non-volatile media and volatile media. Non-volatile media includes, for example, optical or magnetic disks, such as disk drive 410. Volatile media includes dynamic memory, such as system memory 408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 400. According to other embodiments of the invention, two or more computer systems 400 coupled by communication link 415 (e.g., LAN, PTSN, or wireless network) may perform the sequence of instructions required to practice the invention in coordination with one another.

Computer system 400 may transmit and receive messages, data, and instructions, including program, i.e., application code, through communication link 415 and communication interface 414. Received program code may be executed by processor 407 as it is received, and/or stored in disk drive 410, or other non-volatile storage for later execution. In an embodiment, the computer system 400 operates in conjunction with a data storage system 431, e.g., a data storage system 431 that contains a database 432 that is readily accessible by the computer system 400. The computer system 400 communicates with the data storage system 431 through a data interface 433. A data interface 433, which is coupled to the bus 406, transmits and receives electrical, electromagnetic or optical signals that include data streams representing various types of signal information, e.g., instructions, messages and data. In embodiments of the invention, the functions of the data interface 433 may be performed by the communication interface 414.

Figure 5:
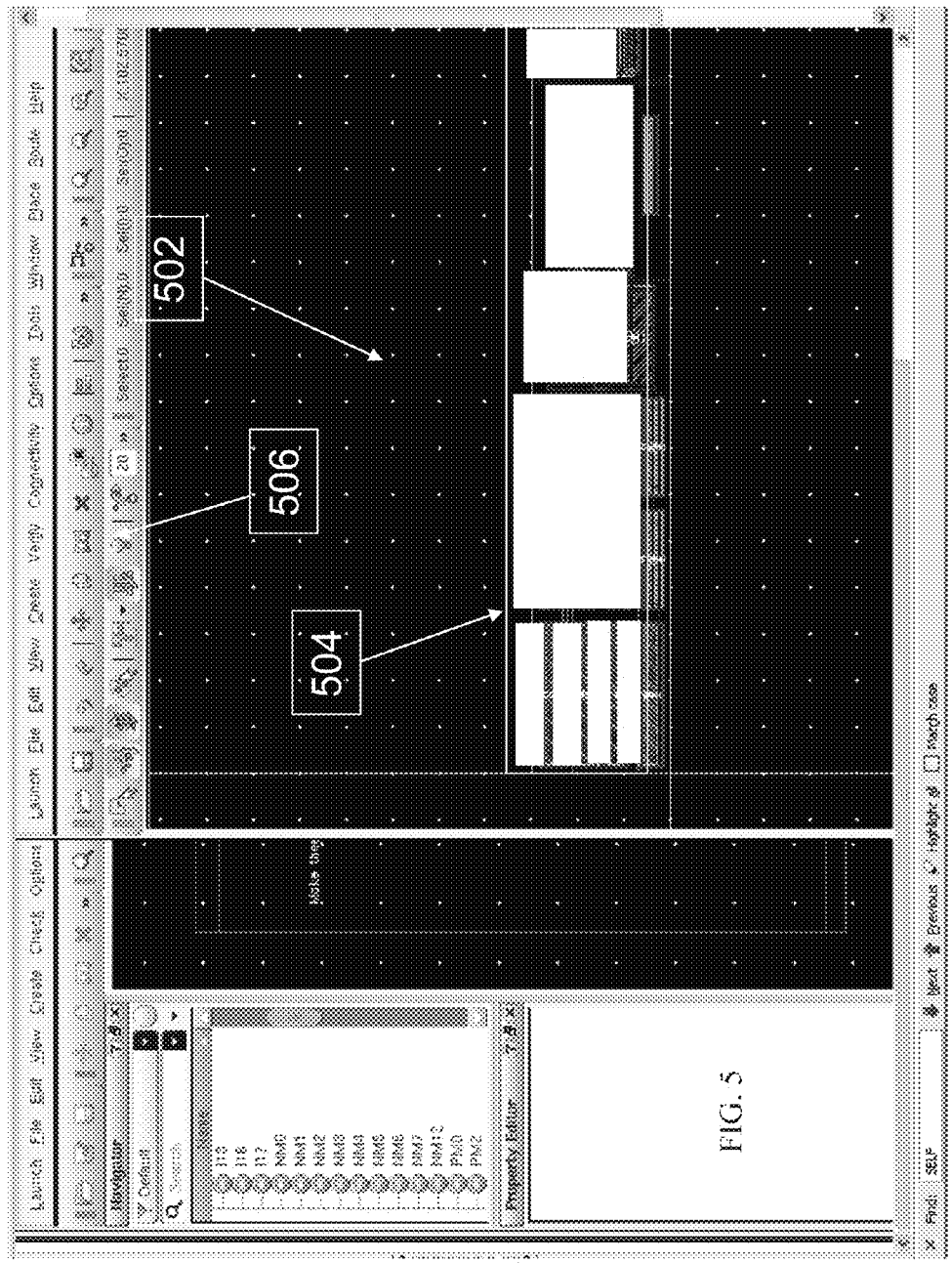
FIGS. 5-27 illustrate more details for the user interface for providing customizable information in designing electronic circuits with electrical awareness in some embodiments.
Figure 6:
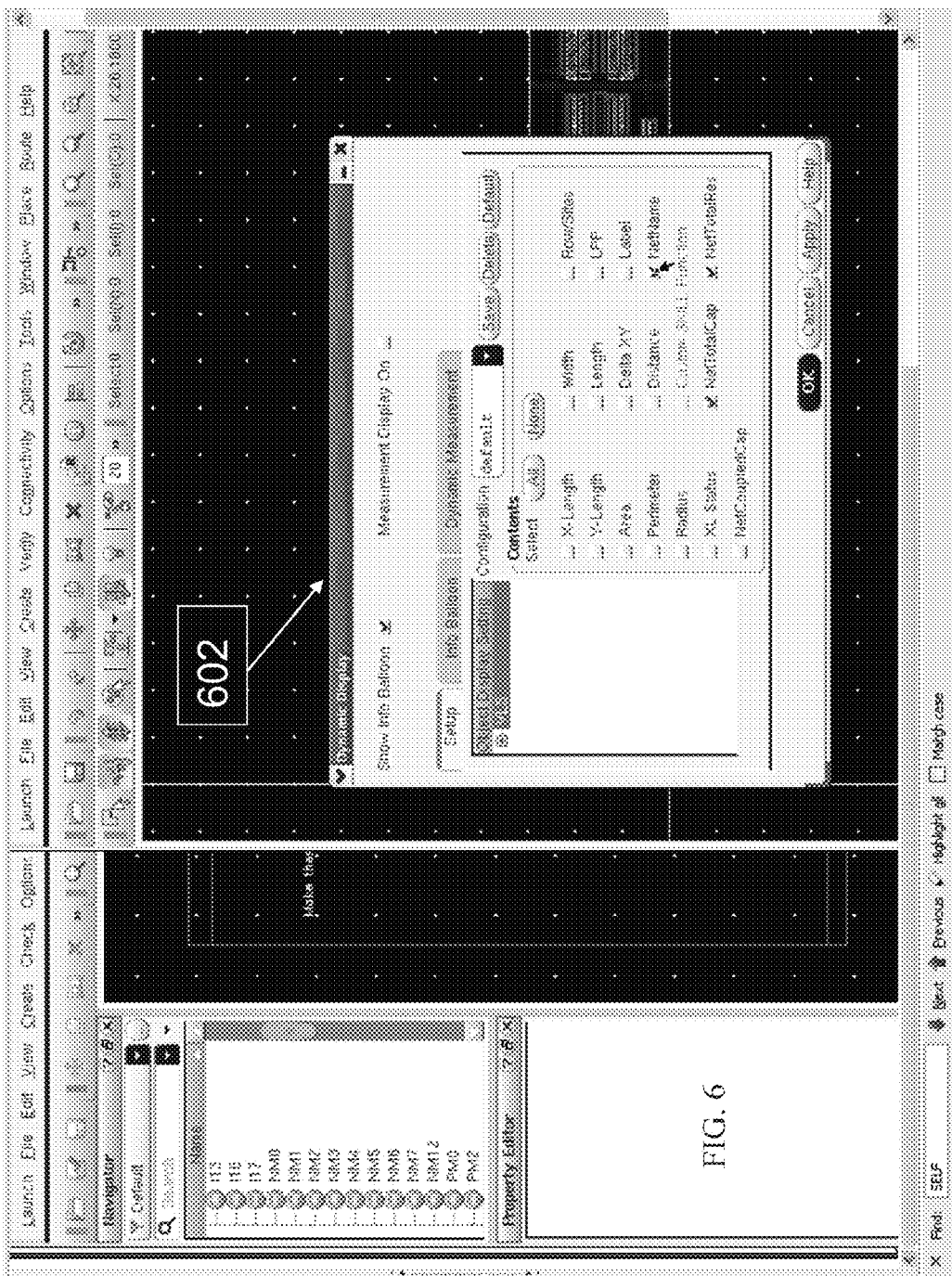

FIG. 5-27 illustrate various user interface screen shots to demonstrate various functionalities for providing in situ, real-time, customizable information in designing electronic circuits with electrical awareness. More particularly, FIG. 5 illustrates a portion of a layout 504 in a physical design display portion 502 and various menu items 506 of the user interface. FIG. 6 illustrates a physical design display portion content control dialog box 602 where the user may select, for example, whether information balloons are going to be shown or whether measurement display is to be shown. The control dialog box 602 also provides customizable contents for the physical design display portion. For example, a user may choose whether or not to display certain physical data of components (e.g., X-Length, Y-Length, Width, Area, Length, Label of the component, Perimeter, Radius, etc.) The user may also customize the display to show capacitance(s) (e.g., total capacitance of a net, coupling capacitance between one net and another net, etc.), resistance (e.g., the total resistance of a net, etc.), or other electrical parasitics.

Figure 7:
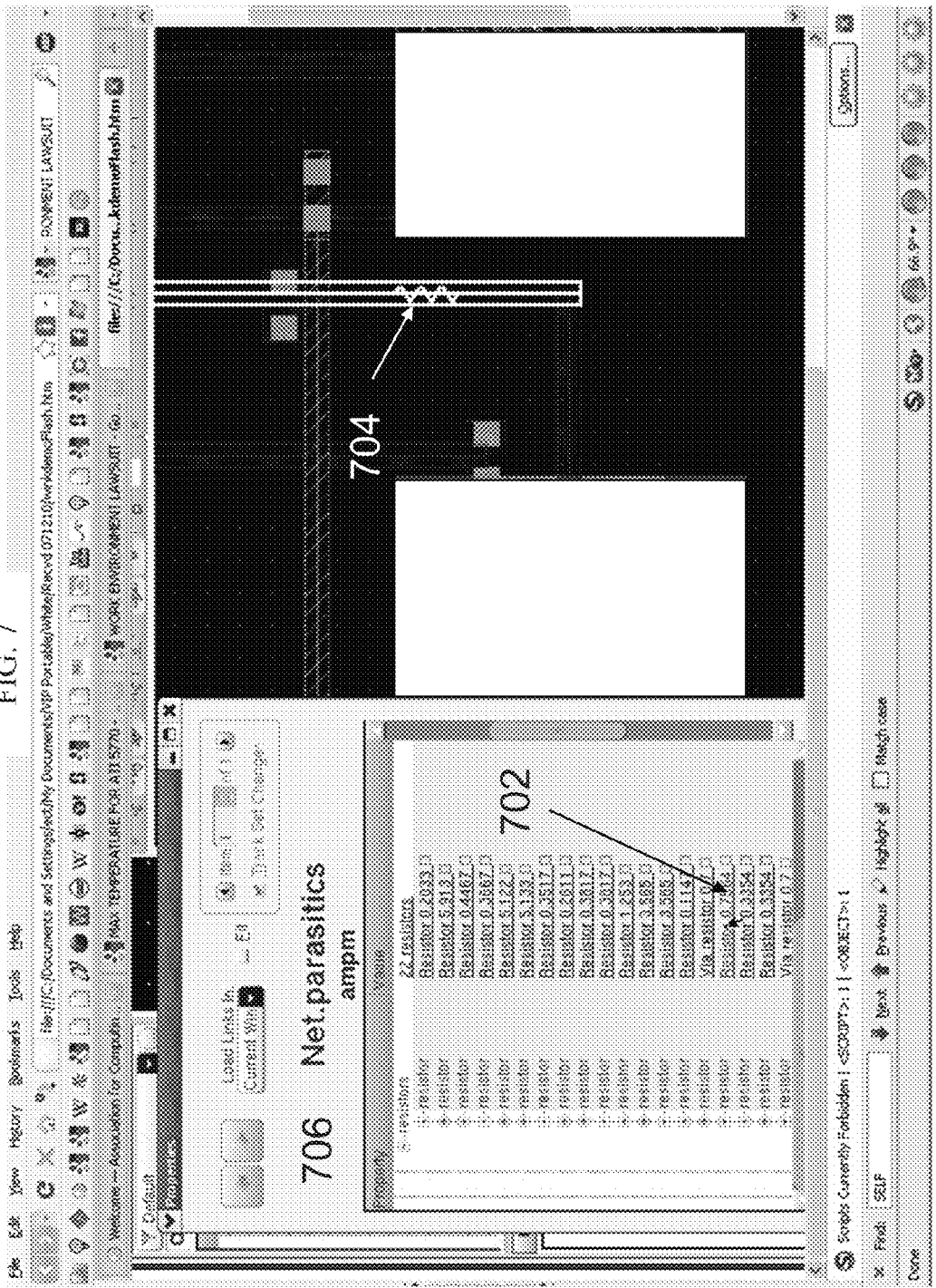

FIG. 7 illustrates a user interface in which some physical components of a portion of a physical design is shown in the physical design display portion of a layout editor. More specifically, the user interface illustrated in FIG. 7 further shows a list of electrical parasitics in a dialog box 706 which lists, for example and among other items, a collapsible tree of resistors. The collapsible parasitics tree of resistors lists a plurality of resistors at the first level, and each resistor listed under the collapsible parasitics tree may be further expanded to show further information.

In addition, the collapsible parasitics tree is associated with a summary of the tree which may comprise, for example but not limited to, the total number of resistors in the portion of the physical design. Furthermore, each resistor listed in the collapsible parasitics tree is also associated with a summary which comprises, for example but not limited to, the resistance value of the particular resistor. Moreover, each resistor may be associated with other information. For example, a particular resistor may be associated with the physical data such as material, length, width, temperature, locations, etc. such that the user or the system may manipulate the resistor by changing the physical data. For example, in some embodiments where an electro-migration analysis is performed and found that the maximum current through a particular wire segment exceeds the maximum allowable limit, the system or the user may alter a width of the wire segment to meet the maximum allowable current limit by, for example, dragging the wire 704 to increase its width or changing the value of the width to perform automatic or assisted fix of the electro-migration violation based on a hint or recommendation provided by the system.

In some embodiments when a user clicks on or moves a user interface cursor (e.g., a mouse cursor) over a particular resistor 702, this particular resistor becomes highlighted (for example, in red) and the corresponding component or a portion thereof is also highlighted (for example, in white as show in the physical design display portion). Moreover, a resistor symbol 704 may be shown while providing connectivity information for this particular resistor. In some embodiments, a user may click on or move the user interface cursor over a particular component or a portion thereof 704 in the physical design display portion, and the corresponding resistor in the collapsible parasitics tree may be shown as highlighted (for example, in red). In this manner, a user may easily identify or manipulate the layout even down to the individual component level.

Figure 8:
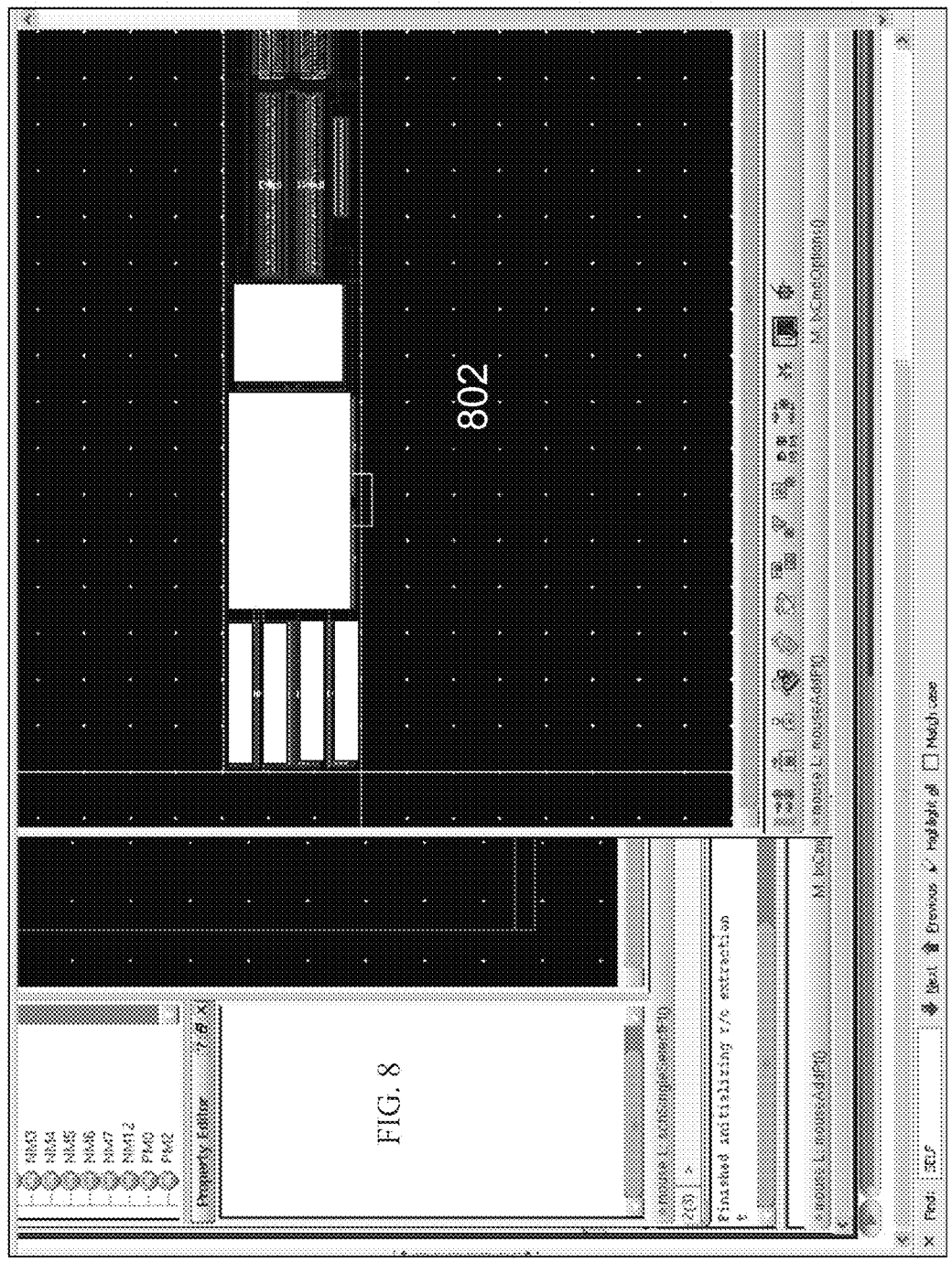
Figure 9:
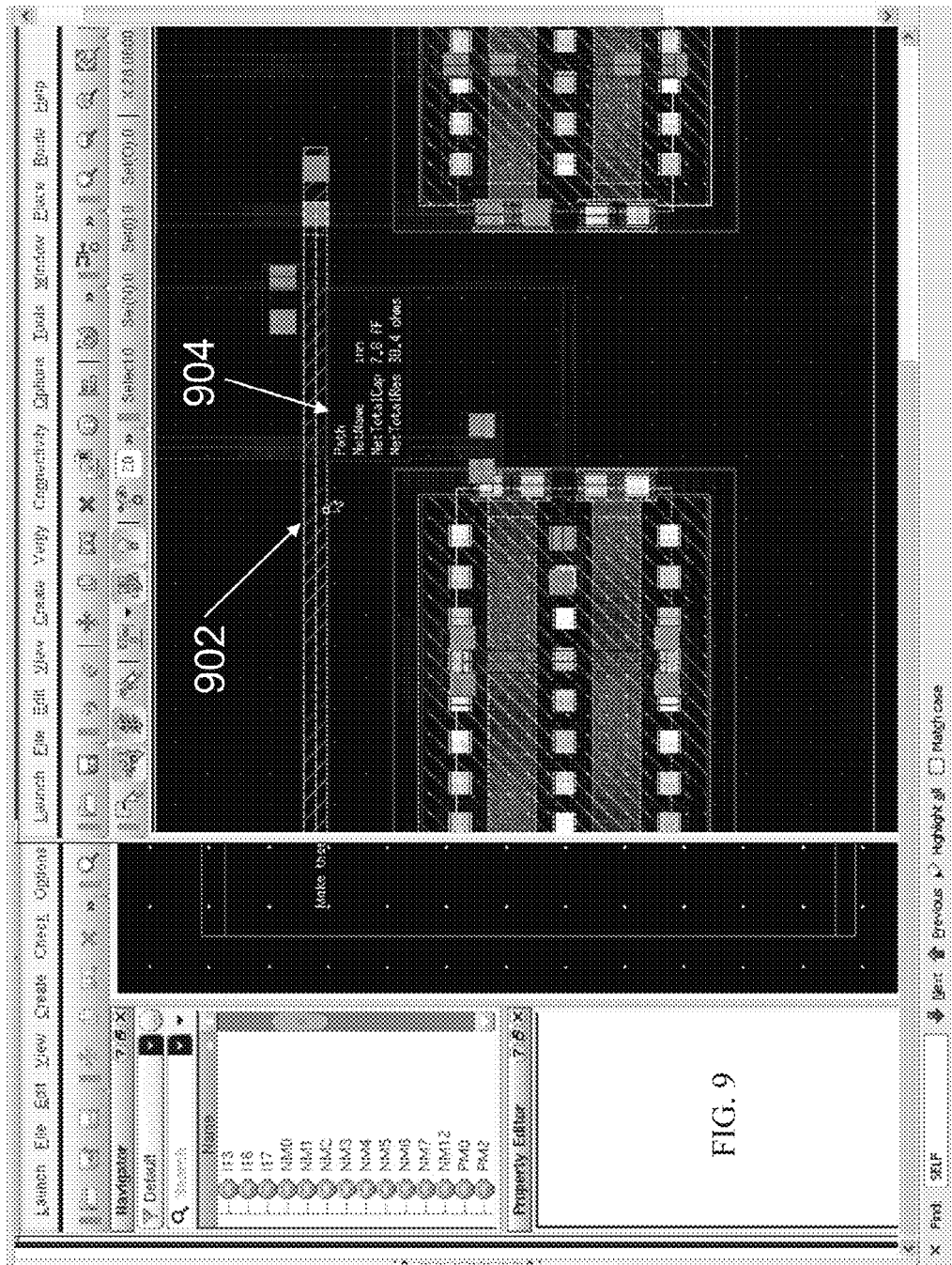

FIG. 8 illustrates a user interface showing a portion of a physical design in the physical design display portion where a user defines an area of interest 802. FIG. 9 illustrates the zoomed in view of the area of interest in FIG. 8. FIG. 9 further illustrates that a user clicks on or move the user interface cursor over a component 902, and the system's automatic response 904 to the user's manipulation of the physical design by showing the component in a cross hatch pattern, the path of the component, the name of the net to which the component belongs. FIG. 9 also illustrates that the system's automatic response to the user's manipulation of the physical design by showing some electrical parasitics, for example the net total capacitance, and the net total resistance that are associated with the component.

Figure 10:
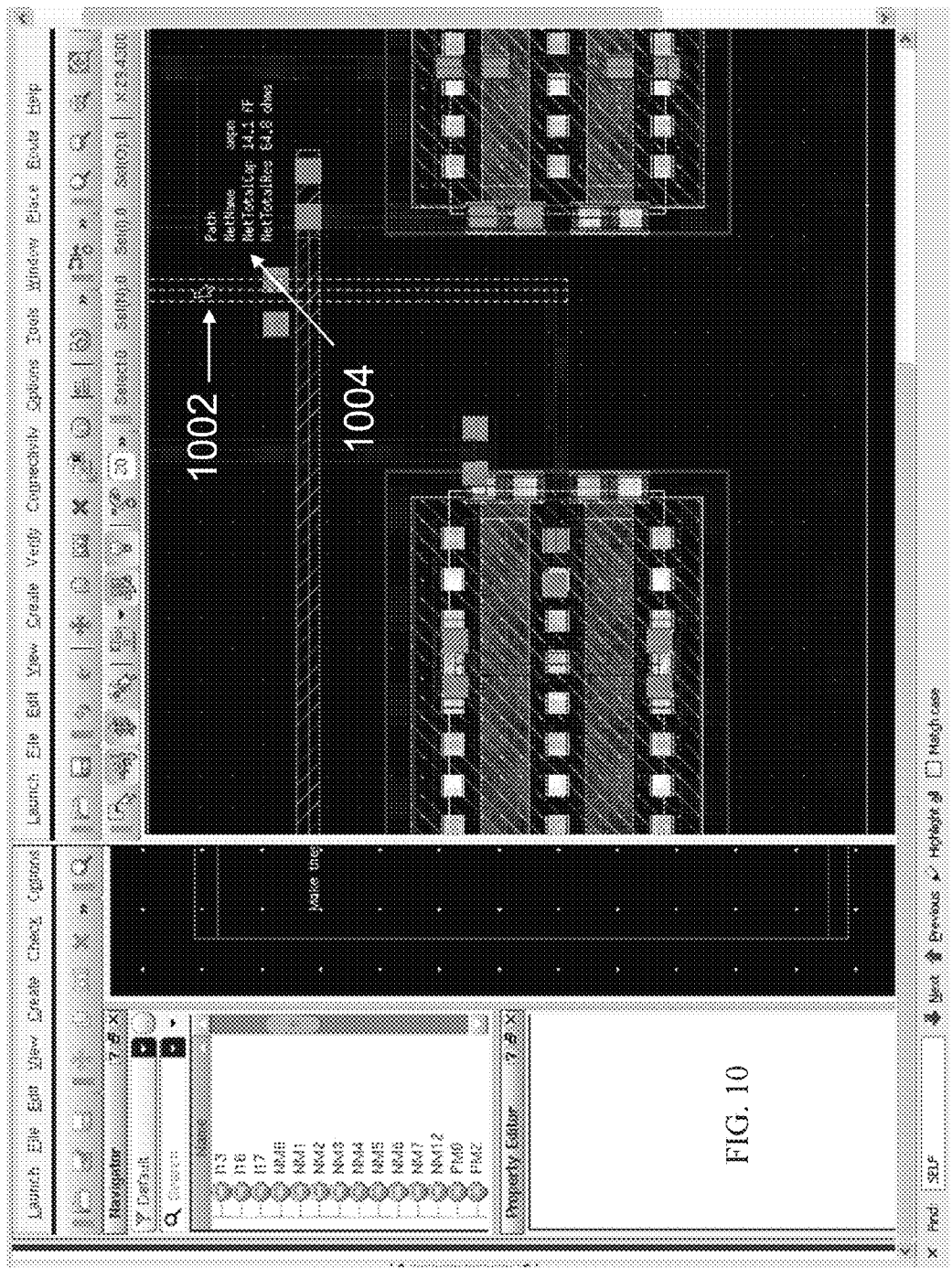

FIG. 10 also illustrates the zoomed in view of the area of interest in FIG. 8. Similar to FIG. 9, FIG. 10 also illustrates that a user clicks on or move the user interface cursor over a component 1002, and the system's automatic response 1004 to the user's manipulation of the physical design by showing the component in a cross hatch pattern, the path of the component, the name of the net to which the component belongs. FIG. 10 also illustrates that the system's automatic response to the user's manipulation of the physical design by showing some electrical parasitics, for example the net total capacitance, and the net total resistance that are associated with the component.

Figure 11A:
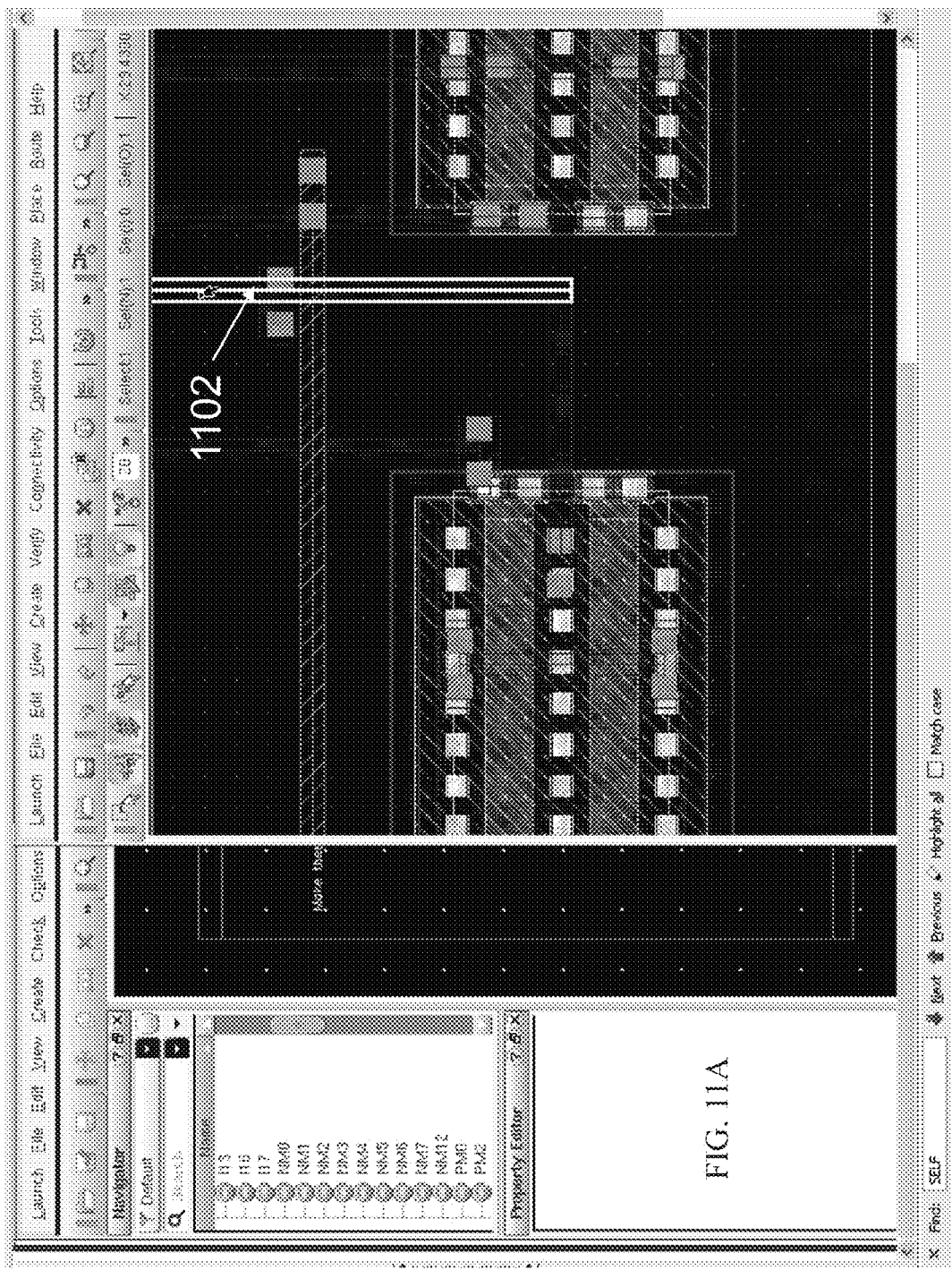
Figure 11B:
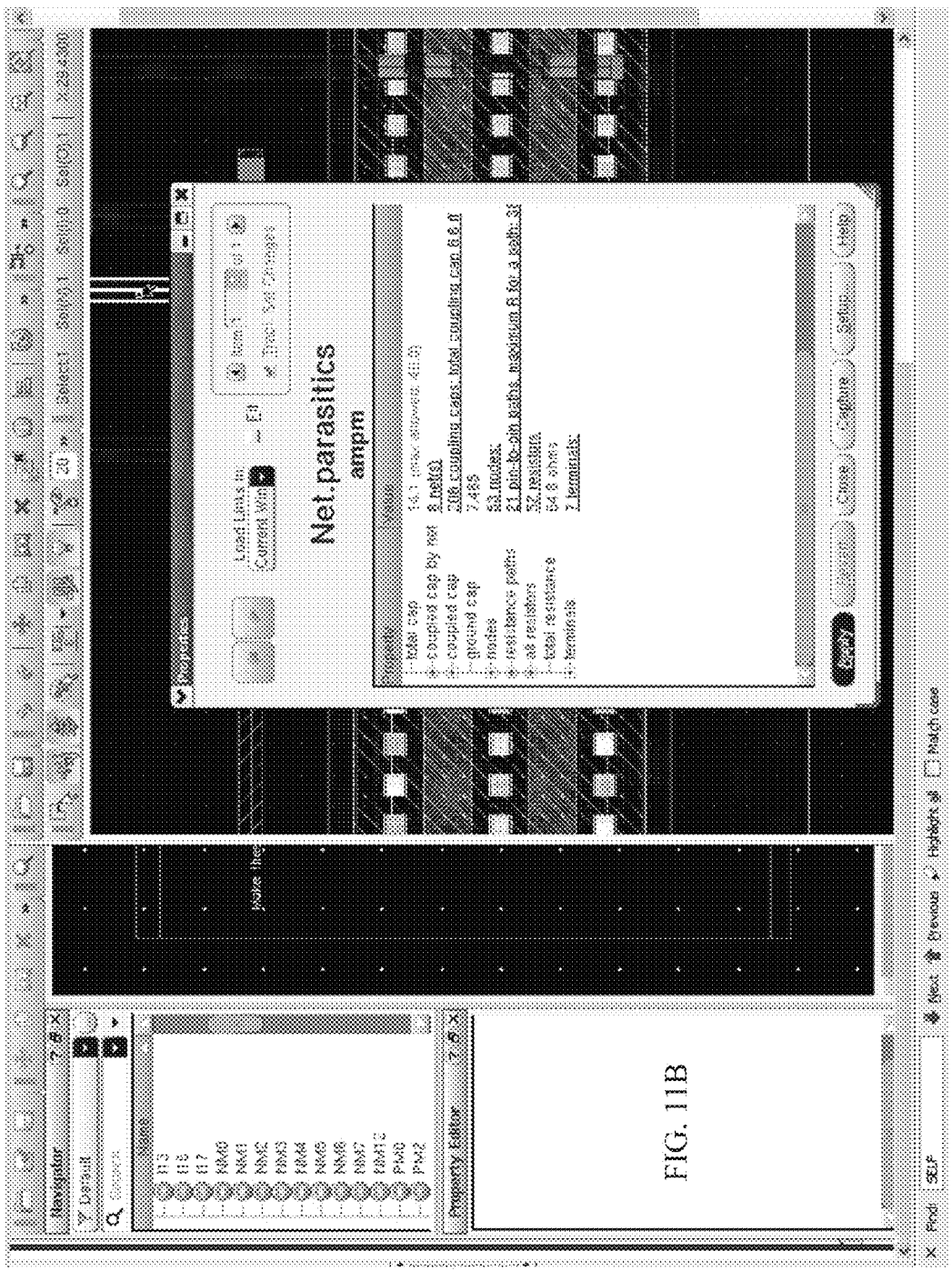
Figure 12:
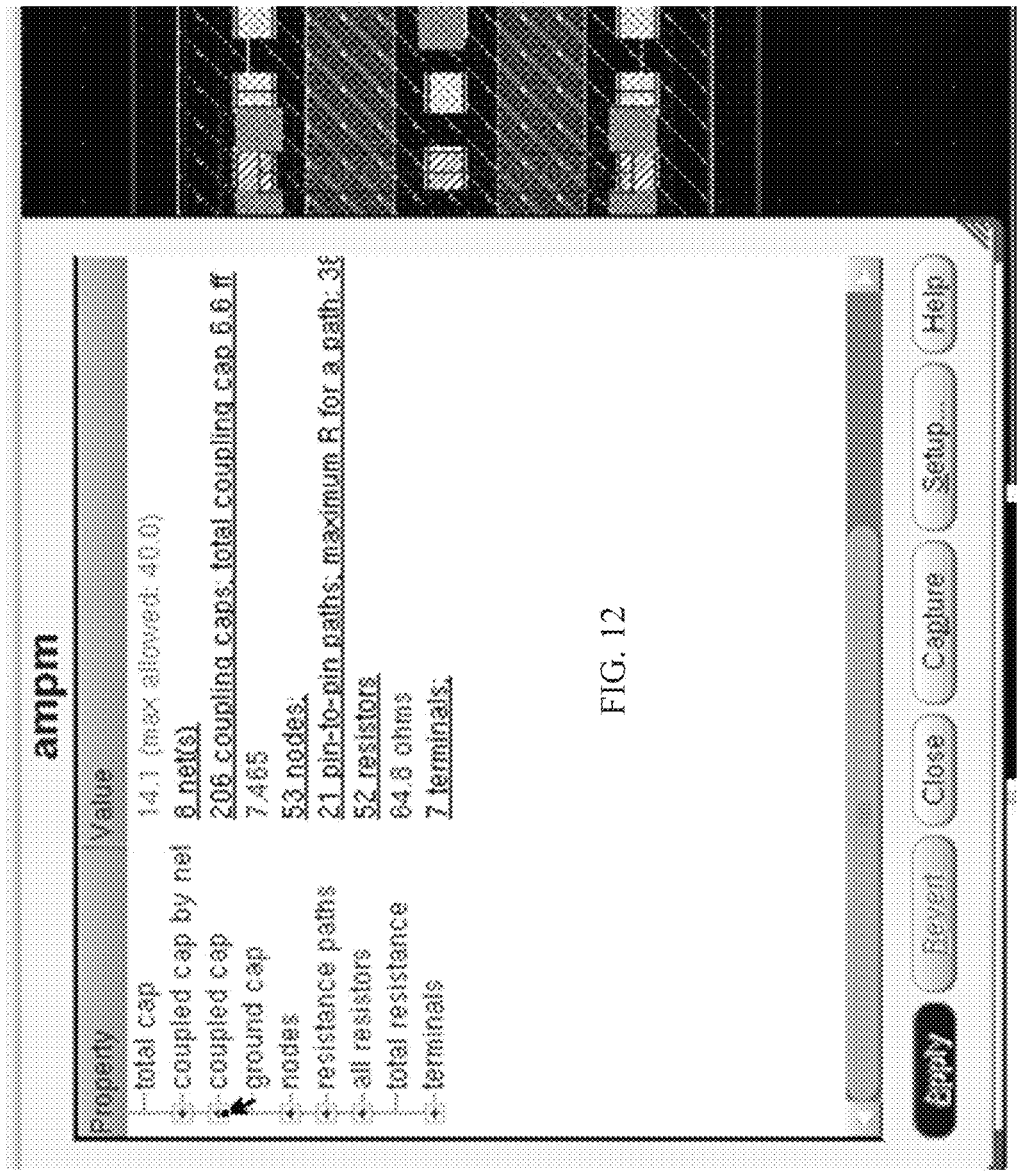

FIGS. 11A-B illustrate a user's selection or identification of a component 1102 and the system's response to the user's manipulation of the physical design by showing the parasitics dialog box. FIG. 12 illustrates further details of the dialog box as shown in FIG. 11B. In some embodiments, the dialog box in response to the user's manipulation of the physical design further lists, for example but not limited to, the total capacitance, the coupled capacitance by net with associated net(s), the coupled capacitance with associated capacitors, the ground capacitance, the number of nodes, the resistance paths with maximum resistance information and the number of pin-to-pin paths, the number of resistors, the total resistance, or the number of terminals that are associated with the selected or identified by the user. As it may be seen from FIG. 12, the dialog box presents the information or data in one or more collapsible trees, where each of the coupled capacitance by net, coupled capacitances, the nodes, the resistance paths, the all resistors, and the terminals constitutes a collapsible tree. FIG. 12 also illustrates that the user move the user interface cursor to the "coupled capacitances" to click on the "+" symbol to expand the tree. The result of the expanded tree of the "coupled capacitances" tree is shown in FIG. 13.

Figure 13:
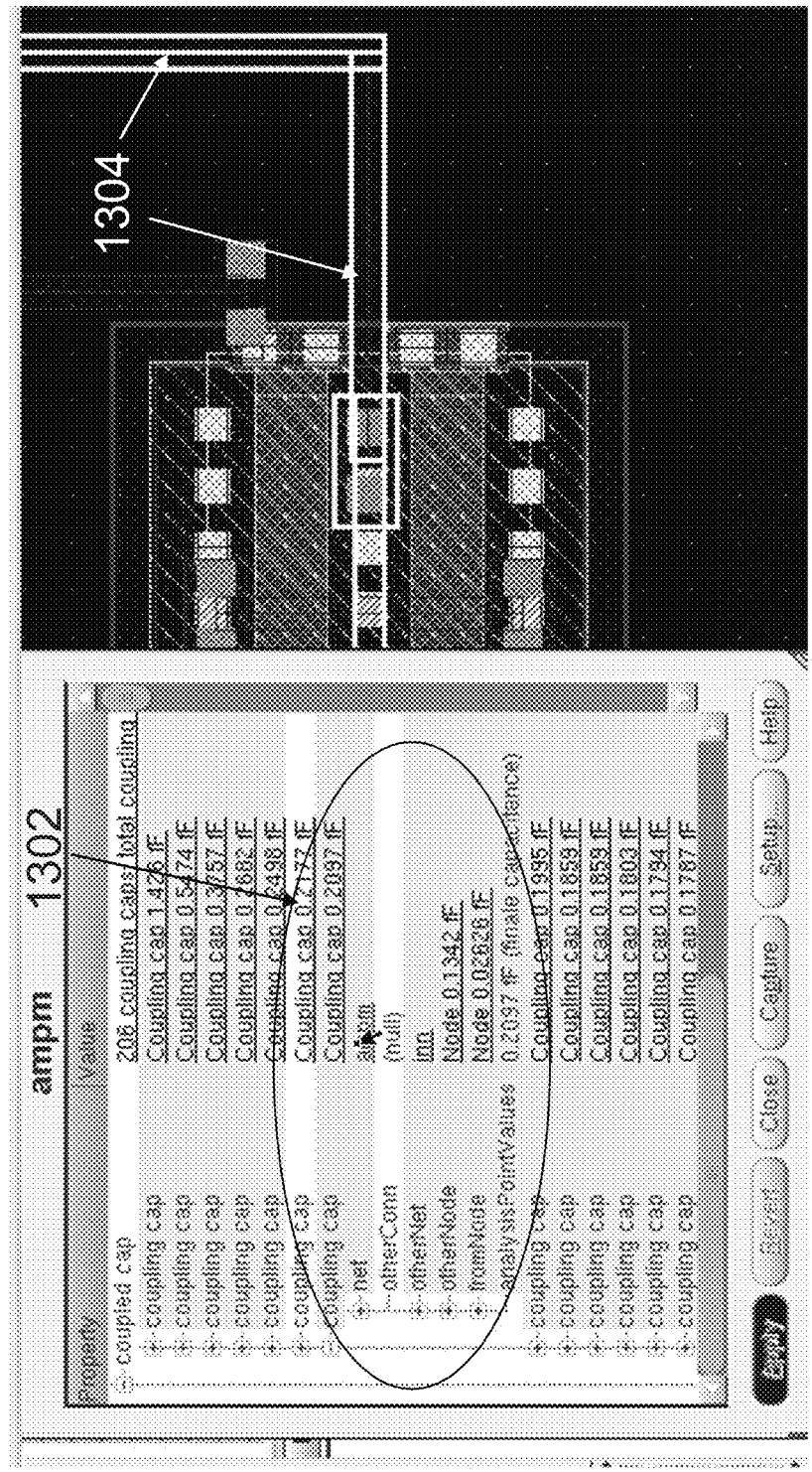

FIG. 13 illustrates the result of the expanded tree of the "coupled capacitances" tree of FIG. 12. Furthermore, FIG. 13 illustrates a list of coupling capacitances, each of which may constitute a collapsible tree with one or more levels in some embodiments. FIG. 13 further shows that when the user expands a particular coupling capacitance 1302, the corresponding components 1304 in the physical design display portion are highlighted (for example, in white). As shown in FIG. 13, this particular capacitance is associated with the net with a name of the net, other nets, other node(s), from node, and the analysis value of the capacitance value (0.2097 fF in this example.)

Figure 14:
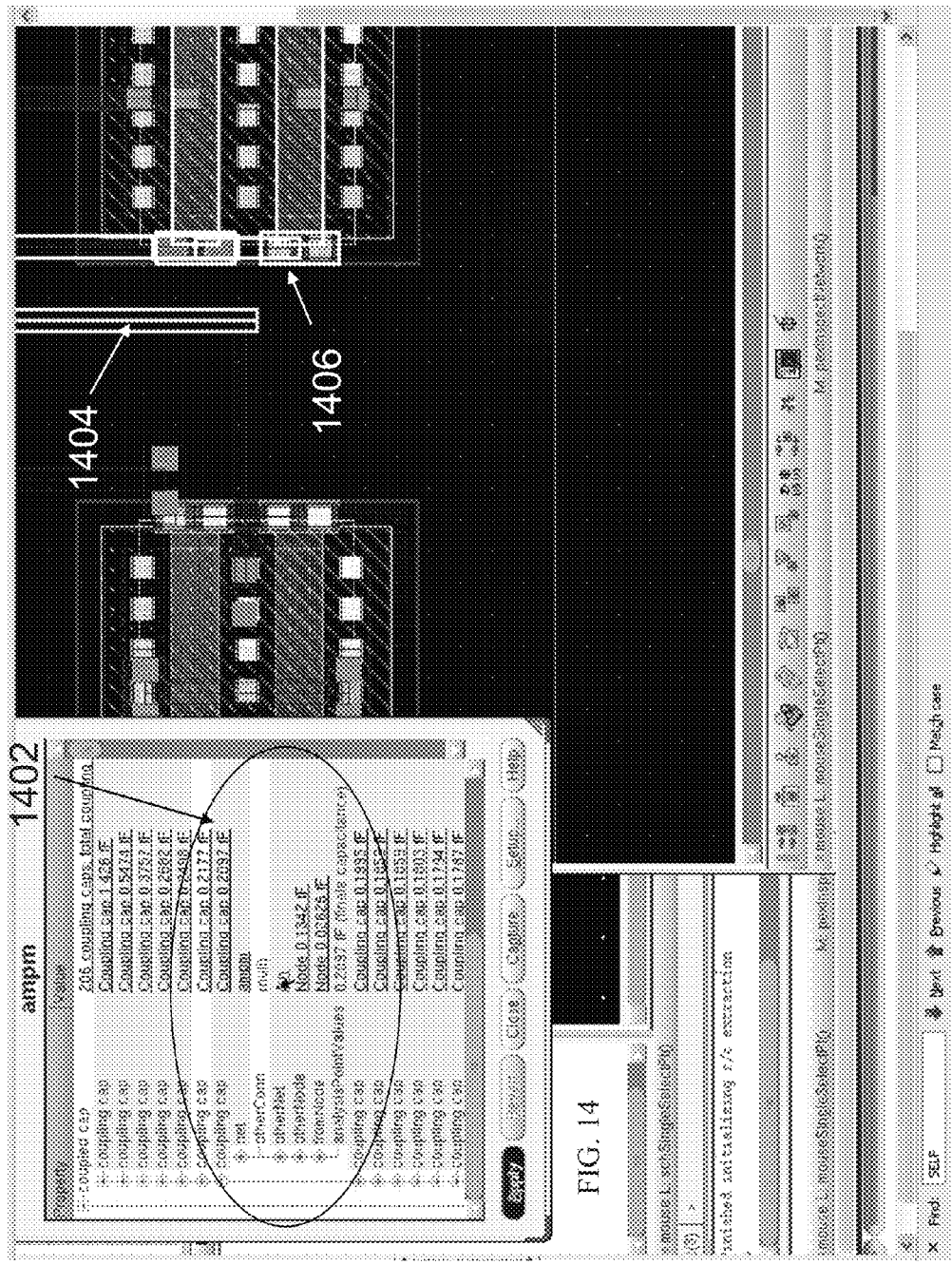

FIG. 14 illustrates further illustrates the interactive feature of the user interface whether the user clicks on or move the user interface cursor over "OtherNet" 1402 in the dialog box to show which net causes the coupling capacitance with the selected or identified net of interest 1404. As it can be seen from this example as illustrated in FIG. 14, the system highlights the net(s) 1406 that have caused coupling capacitance with the net of interest 1404. In this example, the "OtherNet" comprises a collapsible tree which has not been expanded to show individual net that has caused coupling capacitance with the net of interest 1404. As a result, all the nets that have caused coupling capacitance with net of interest are highlighted in the physical design display portion. Moreover, it shall be noted that in the example as illustrated in FIG. 14, the physical design display portion has been expanded either automatically or with assistance to show the nets 1406 that have caused coupling capacitance with the net of interest 1404.

Figure 15:
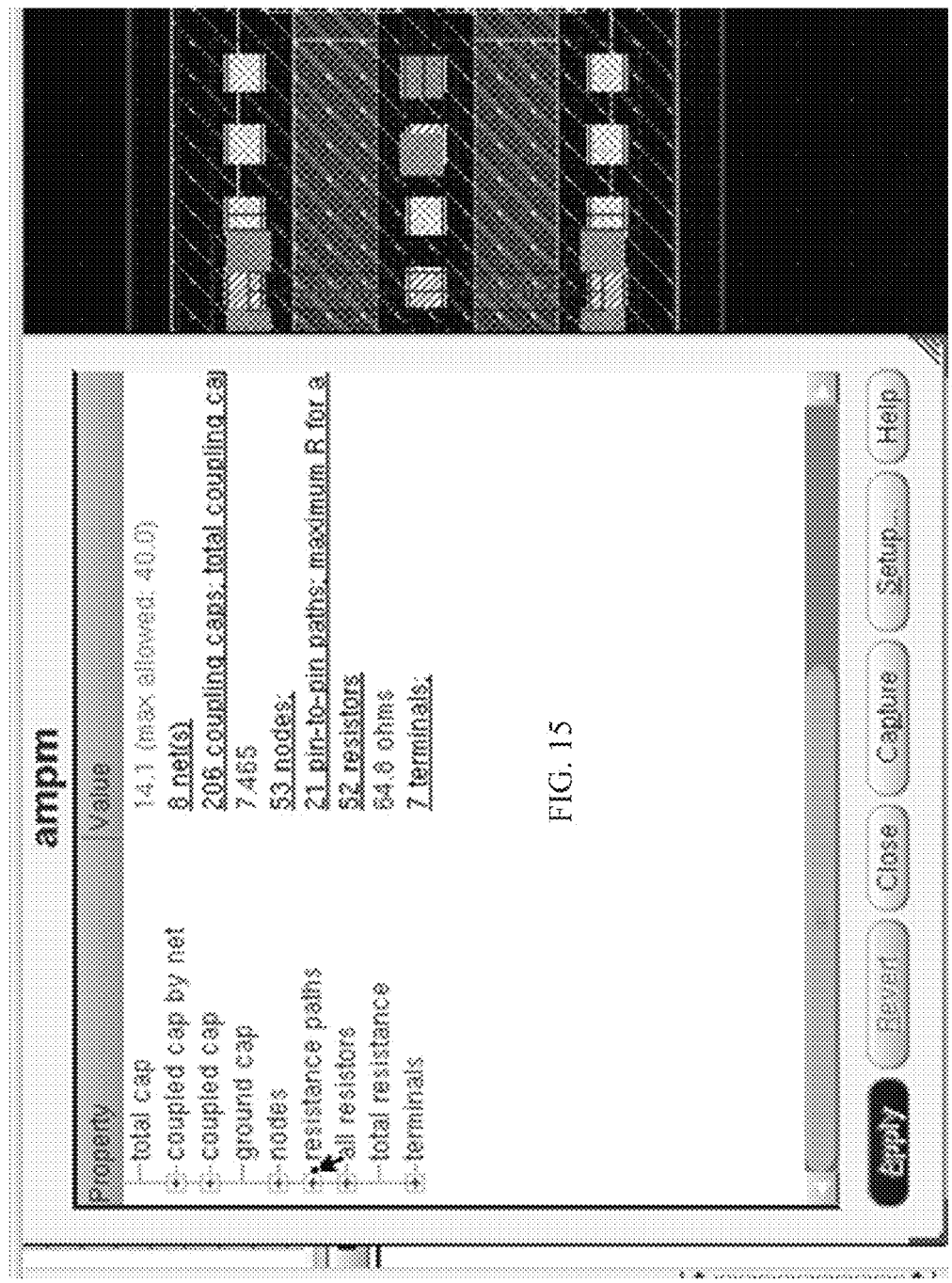
Figure 16:
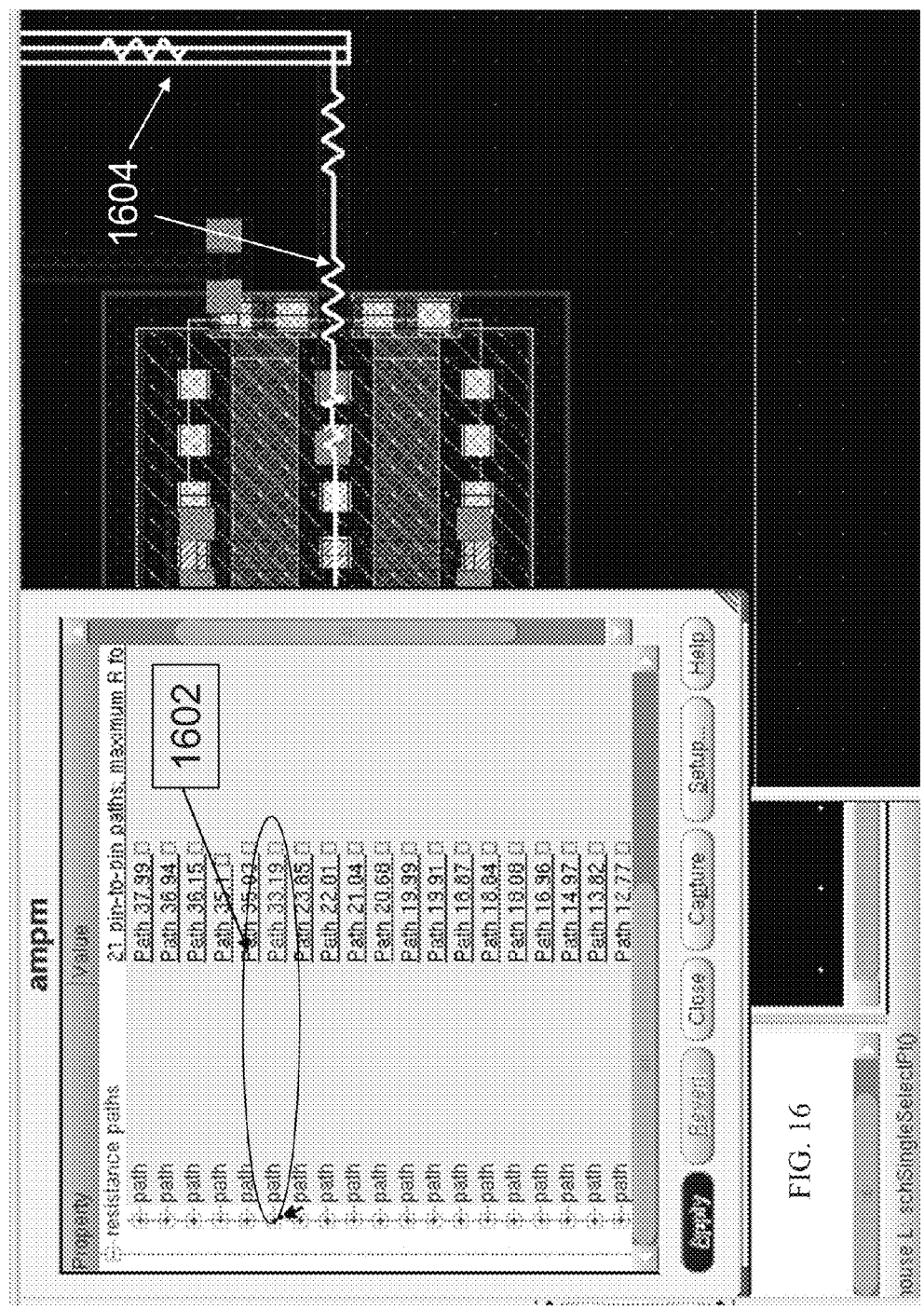

FIG. 15 further illustrates a similar dialog box as that in FIG. 12 which illustrates further details of the dialog box as shown in FIG. 11B. Moreover, FIG. 15 shows that the user moves the user interface cursor to "resistance paths" in an attempt to expand the collapsible tree for "resistance paths". The expanded "resistance paths" is illustrated in FIG. 16. FIG. 16 illustrated the first level of content of the collapsible tree for "resistance path" as shown in FIG. 15. More specifically, FIG. 16 illustrates that the user clicks on or moves the user interface cursor over a particular path 1602. In response to the user's manipulation of the physical design, the system highlights (in red in this example) the path 1602 in the dialog box, highlights (in white in this example) the paths in the physical design display portion, and display the path with a plurality of resistor symbols 1604 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 17:
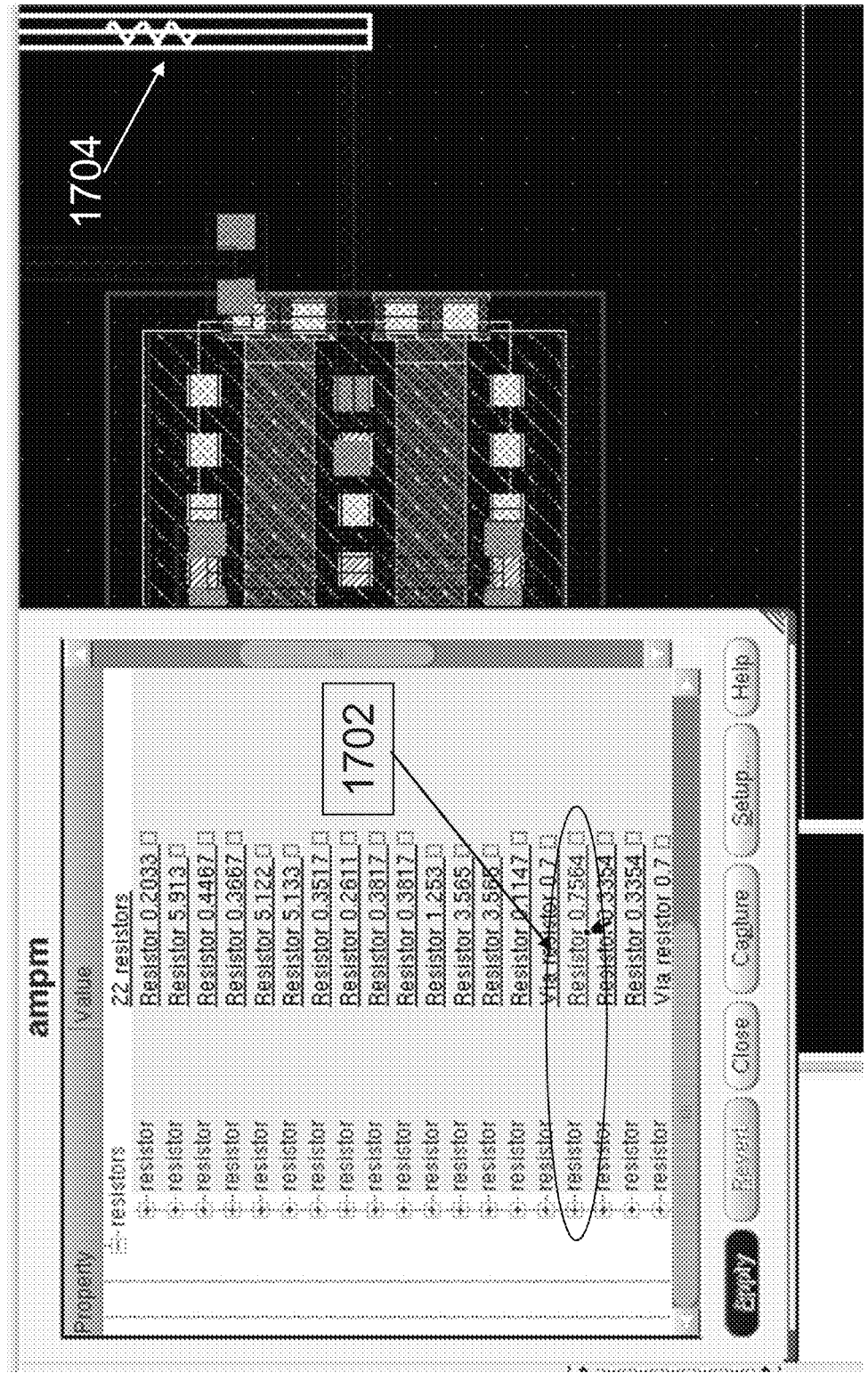

FIG. 17 similarly illustrates the first level of content of the collapsible tree for "resistance path" as shown in FIG. 15. More specifically, FIG. 17 illustrates that the user clicks on or moves the user interface cursor over a particular path 1702. In response to the user's manipulation of the physical design, the system highlights (in red in this example) the path 1702 in the dialog box, highlights (in white in this example) the paths in the physical design display portion, and display the path with a resistor symbol 1704 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 18:
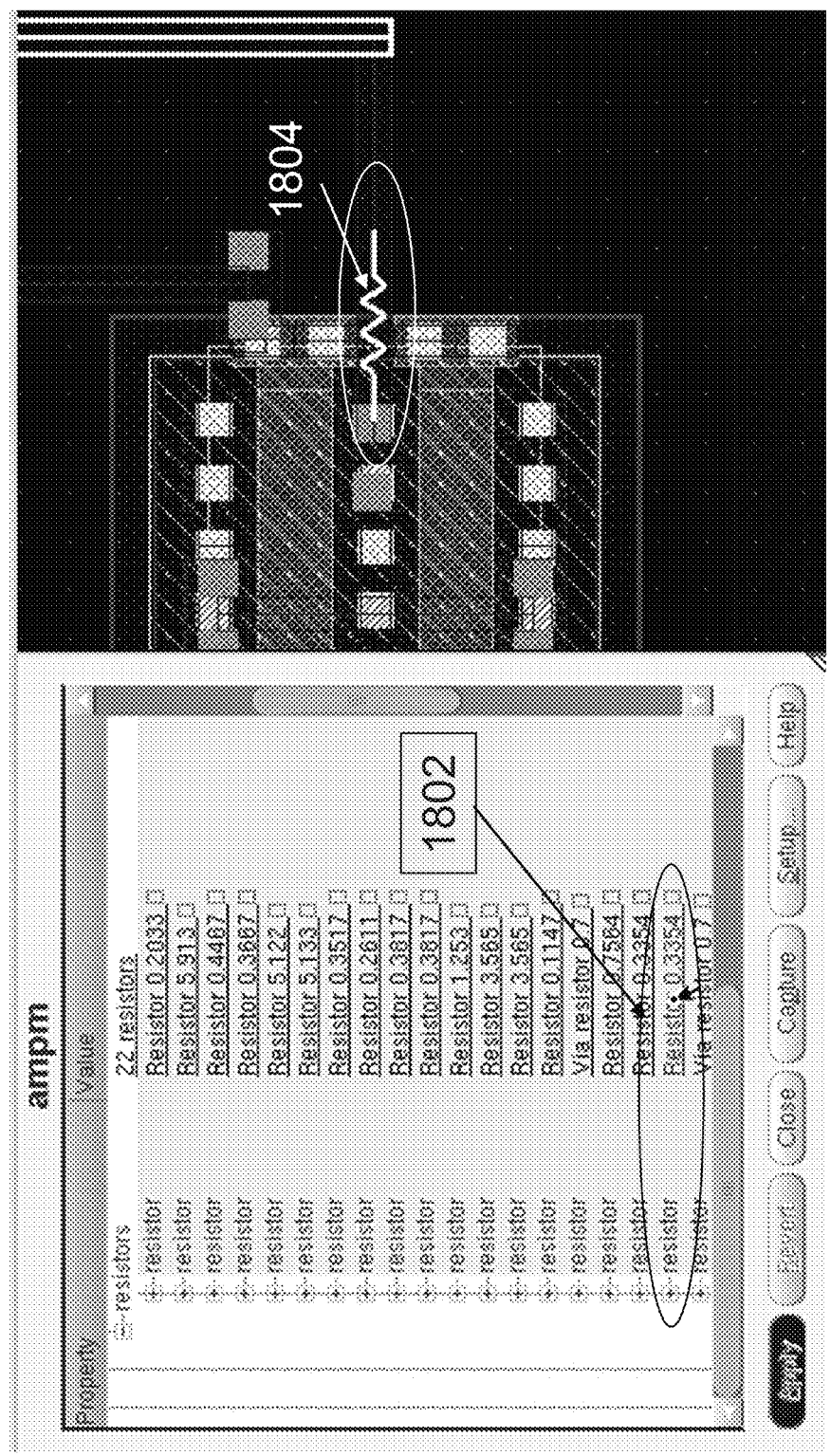

FIG. 18 similarly illustrates the first level of content of the collapsible tree for "resistance path" as shown in FIG. 15. More specifically, FIG. 18 illustrates that the user clicks on or moves the user interface cursor over a particular path 1802. In response to the user's manipulation of the physical design, the system highlights (in red in this example) the path 1802 in the dialog box, highlights (in white in this example) the path(s) in the physical design display portion, and display the path with a resistor symbol 1804 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 19:
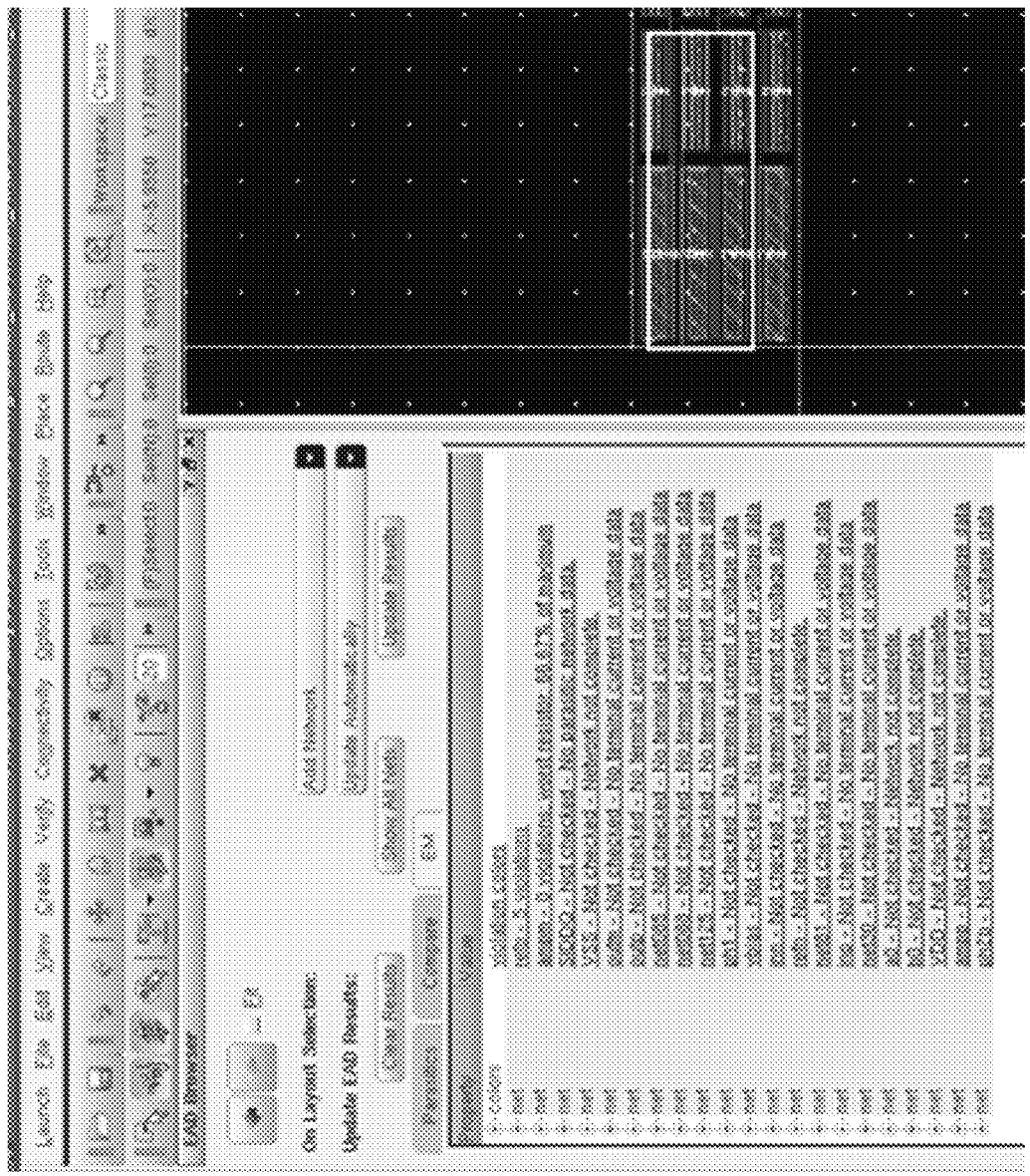
Figure 20:
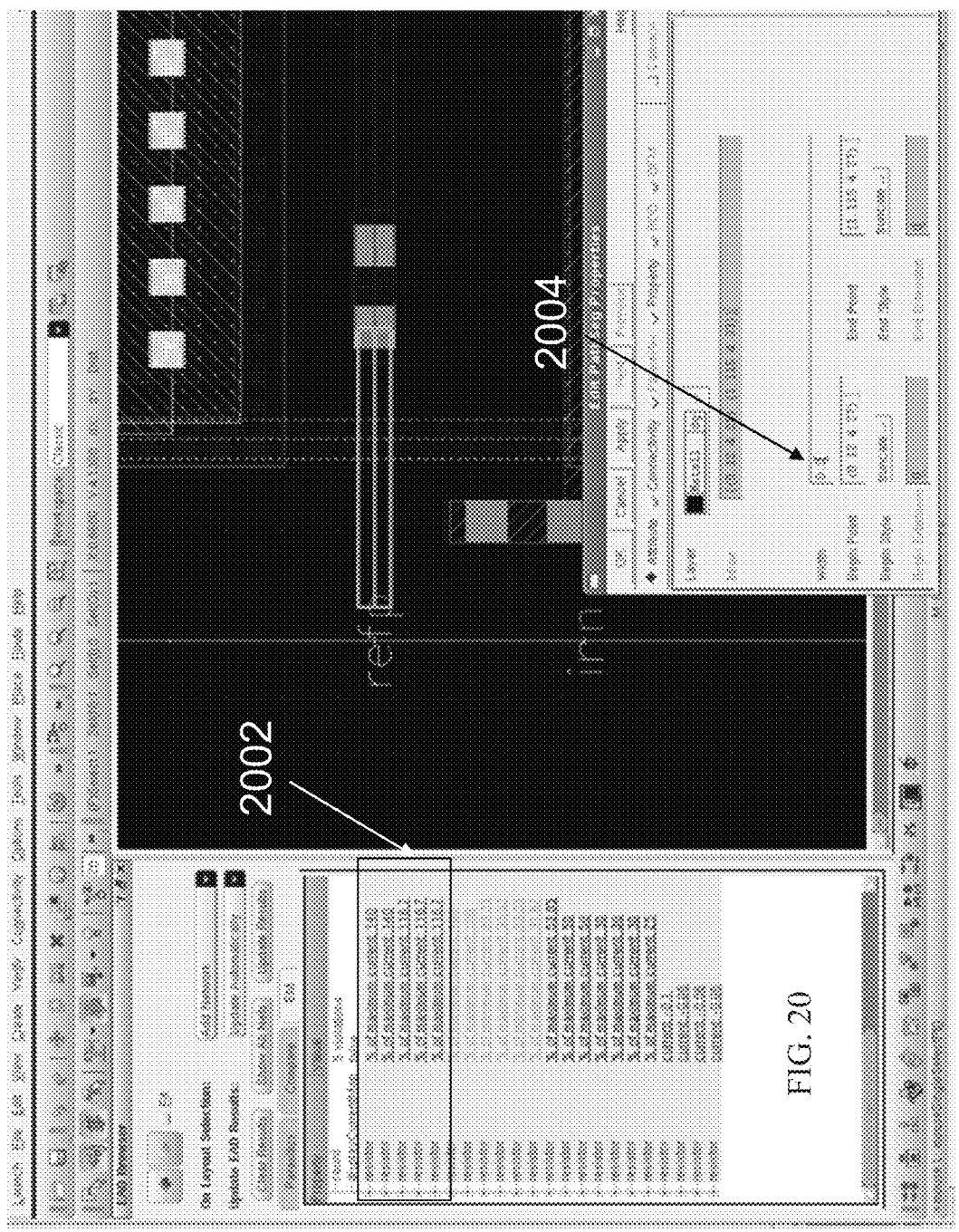

FIG. 19 illustrates the in situ, real-time constraint verification or compliance check result display capability of the user interface in some embodiments. More particularly, the EAD browser display portion shows one or more collapsible trees for electro-migration analysis results, one of which indicates that there are five violations and is highlighted in red. The right-hand side of the user interface display the a portion of the physical design. FIG. 20 illustrates the expanded view of the collapsible tree indicating the five violations. More particularly, FIG. 20 shows the first level of content of the collapsible tree indicating the five violations 2002 in the left-hand side of the user interface. As it can be seen from the example as illustrated in FIG. 20, each of the five violations is associated with brief description of the violation. In this instant example, all five resistors are indicated as violations because the percentage of the maximum current is over 100% of the maximum allowable current in each resistor. It shall be further noted that each of the first level items in the collapsible tree may be further expanded as previously discussed to display further information for interaction purposes. FIG. 20 further shows that the resistors through which the respective maximum current is over 100% of the maximum allowable current are all shown in red; the resistors through which the respective maximum current is between, for example, 90% to 100% of the maximum allowable current are all shown in orange; and the resistors through which the respective maximum current is 50% or less of the maximum allowable current are all shown in blue. It shall be noted that the thermal map display of various resistors carrying different maximum currents do not necessarily have to be displayed in this color arrangement, and that the above thermal map is used as an example to explain and illustrate the capabilities of the user interface. Moreover, FIG. 20 further shows a dialog box which provides the user with the ability to change the physical data of a specific component. In this example, the dialog box presents the user with the option of entering different width value 2004 for a particular resistor. The user may enter a different width value, and the system will determine whether the entered value complies with the electro-migration constraint automatically. The system may also provide hints, suggestions, or recommendations to the user via similar means so the user may know how to fix the violations in some embodiments.

Figure 21:
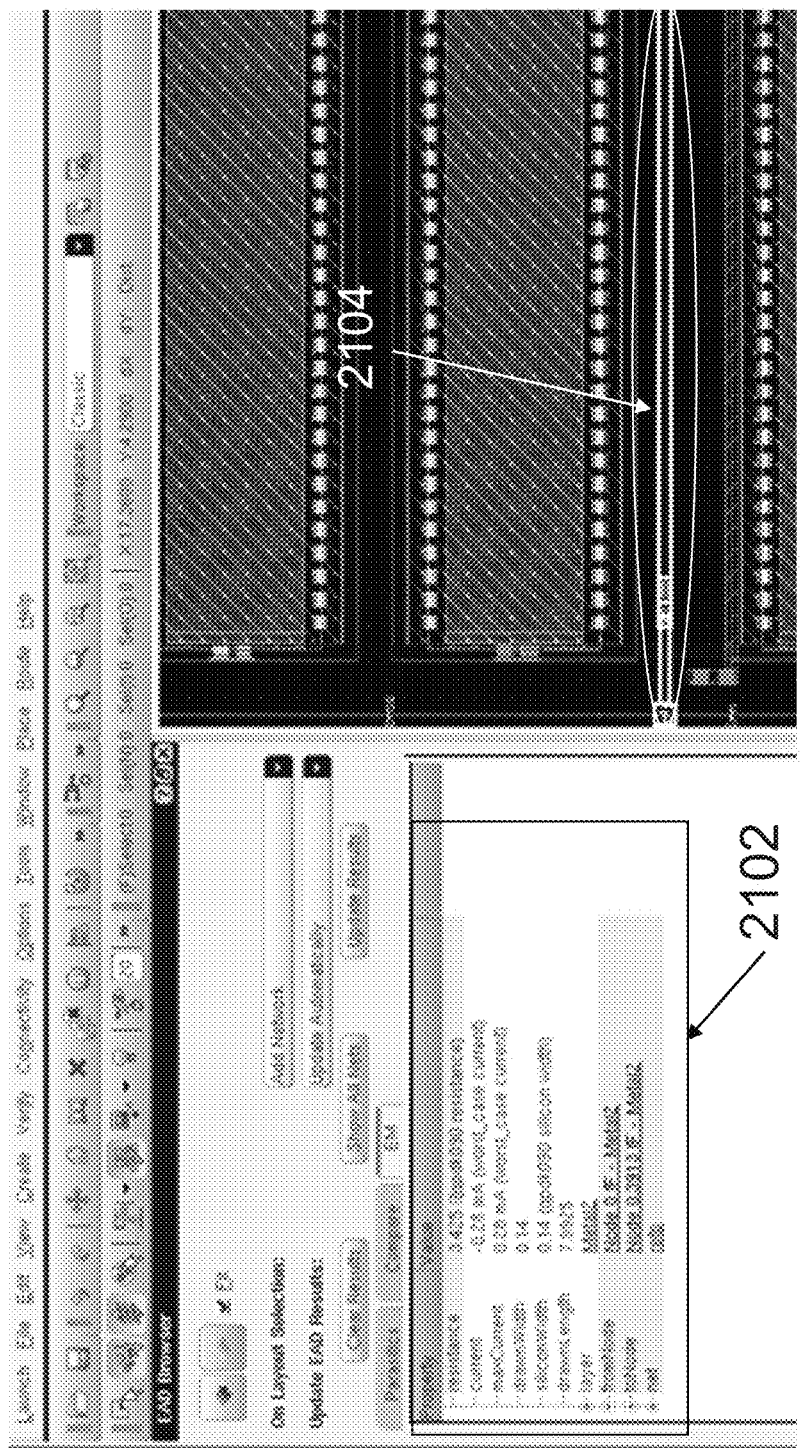

FIG. 21 illustrates the expanded view of a collapsible tree of a component for the in situ, real-time constraint verification or compliance check (e.g., electro-migration analysis) result display capability in the EAD browser of the user interface in some embodiments. More specifically, FIG. 21*shows* that the user clicks on a particular component in the EAD browser to expand its contents into one or more sub-levels, some of which may be further expanded (2102). In this example, the information or data associated with the component 2104 may comprise some electrical parasitics of the component (e.g., the resistance of the component, etc.), the electrical characteristics of the component (e.g., the current, the maximum current flowing through the component), or some physical data of the component (e.g., the drawn width of the component, the width on silicon, the drawn length, the starting node of the component, the end node of the component, the layer or net to which the component belongs, etc.) as shown in 2102.

FIG. 21 also shows that the corresponding component in the physical design display portion of the user interface is highlighted (2104) in response to the user's manipulation of the physical design. FIG. 21 further illustrates various design editing functions provided by the user interface in some embodiments. For example, the user interface provides a user with the capability (2102) to select layout(s), to add network(s), to determine the system will update the physical design with all or some of the physical data, electrical parasitics, or electrical characteristics. As another example, FIG. 21 further illustrates that the user interface provides the options to the user to compare various characteristics of two or more components (e.g., nets).

Figure 22:
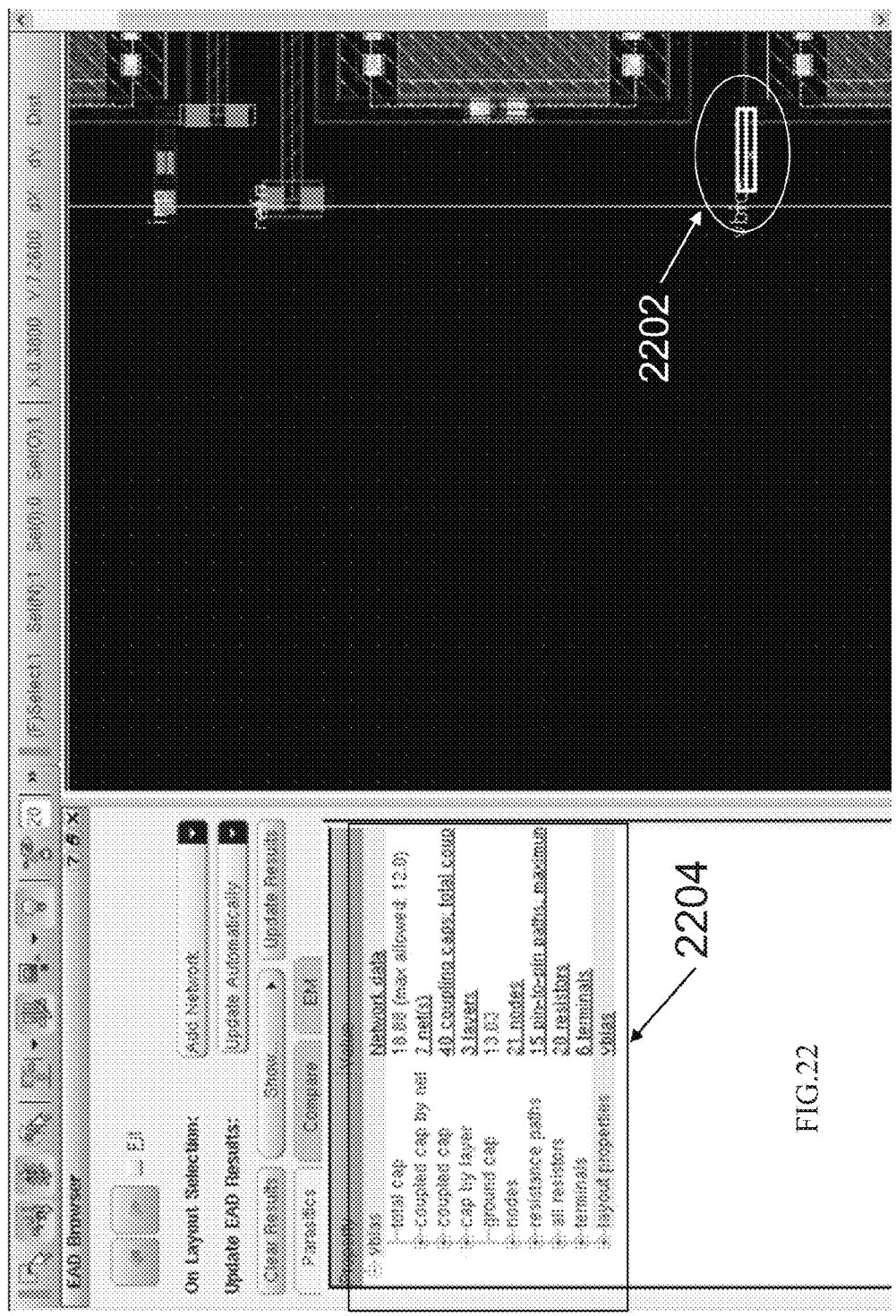

FIG. 22 illustrates the in situ, real-time, and interactive parasitics display capability of the user interface of a physical level electronic circuit design tool in some embodiments. In this example, the user interface shows detailed information of a component that results in a total capacitance over the maximum allowable limit. In this embodiment, the violation is also highlighted in red in the EAD Browser, whereas the remaining data or information that does not cause issues or problems is shown in blue. In addition, in response to the user's expansion of the particular collapsible tree showing a parasitic constraint verification result in 2204, the component 2202 associated with the parasitic constraint verification result is highlighted (for example, in white) as shown in 2202 in the physical design display portion.

In this example, the EAD browser window further shows various data or information that comprises, for example but not limited to, the total capacitance, the coupled capacitance by net, the coupled capacitances, the capacitance by layer, the ground capacitance, the nodes, the resistance paths, the number of resistors, the number of terminals, etc. Moreover, each of the above items of information or data is associated with a description or descriptive value, and some of the above items of information or data may be further expanded to display additional information or data.

Figure 23:
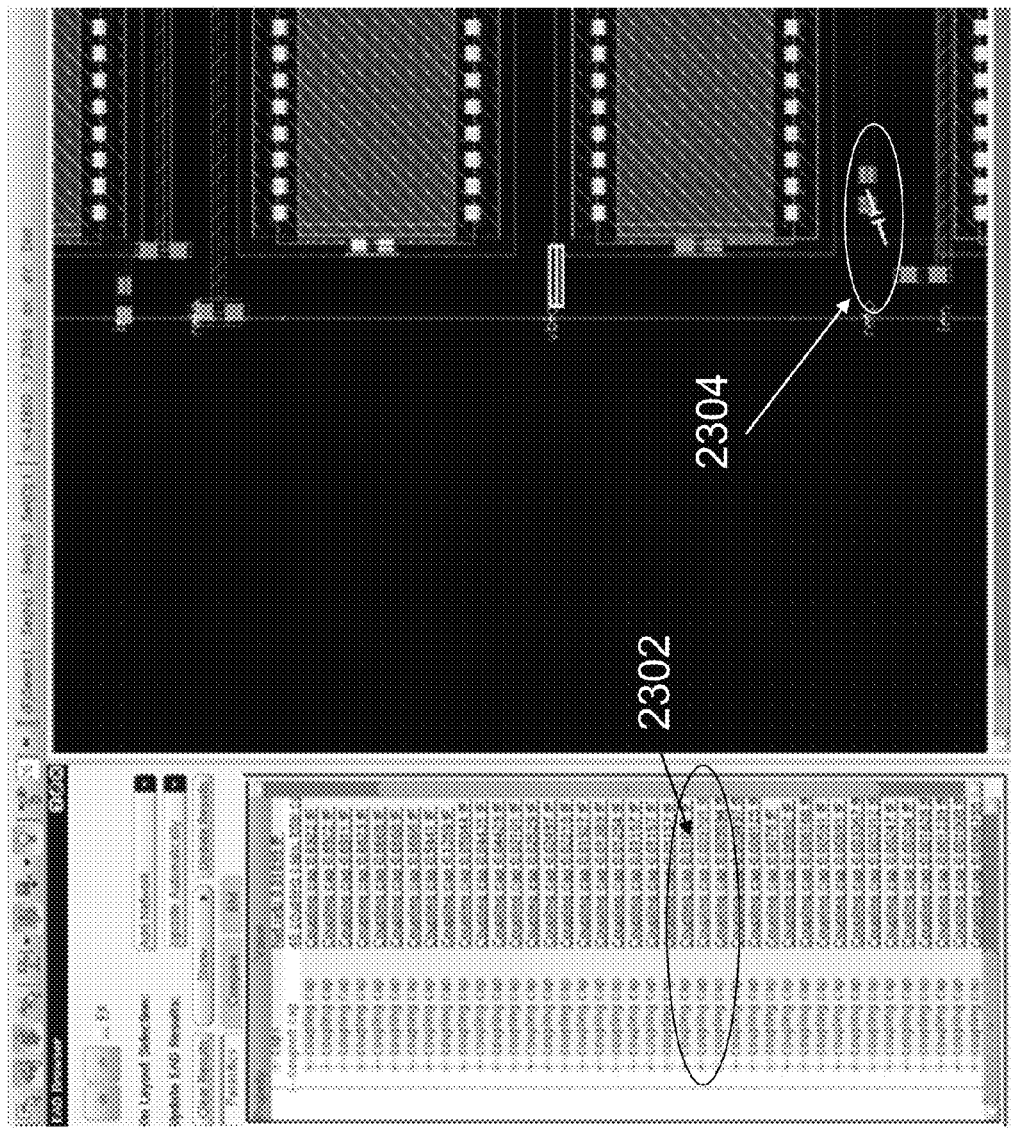

FIG. 23 illustrates the further expanded view of the "coupled cap" item which comprises a plurality of coupling capacitances, some or all of which may be further expanded to show additional information or data. In this example, a coupling capacitance is identified and highlighted in red and is associated with a description of 0.009701 fF as shown in 2302. The "coupled cap" collapsible tree is also associated with a brief description of the total number of capacitances and the total coupling capacitance.

In addition, when a particular coupling capacitance is identified in the EAD browser window, the corresponding component that causes the coupling capacitance is highlighted and is represented by a capacitance symbol in the physical design display portion of the user interface as shown in 2304.

Figure 24:
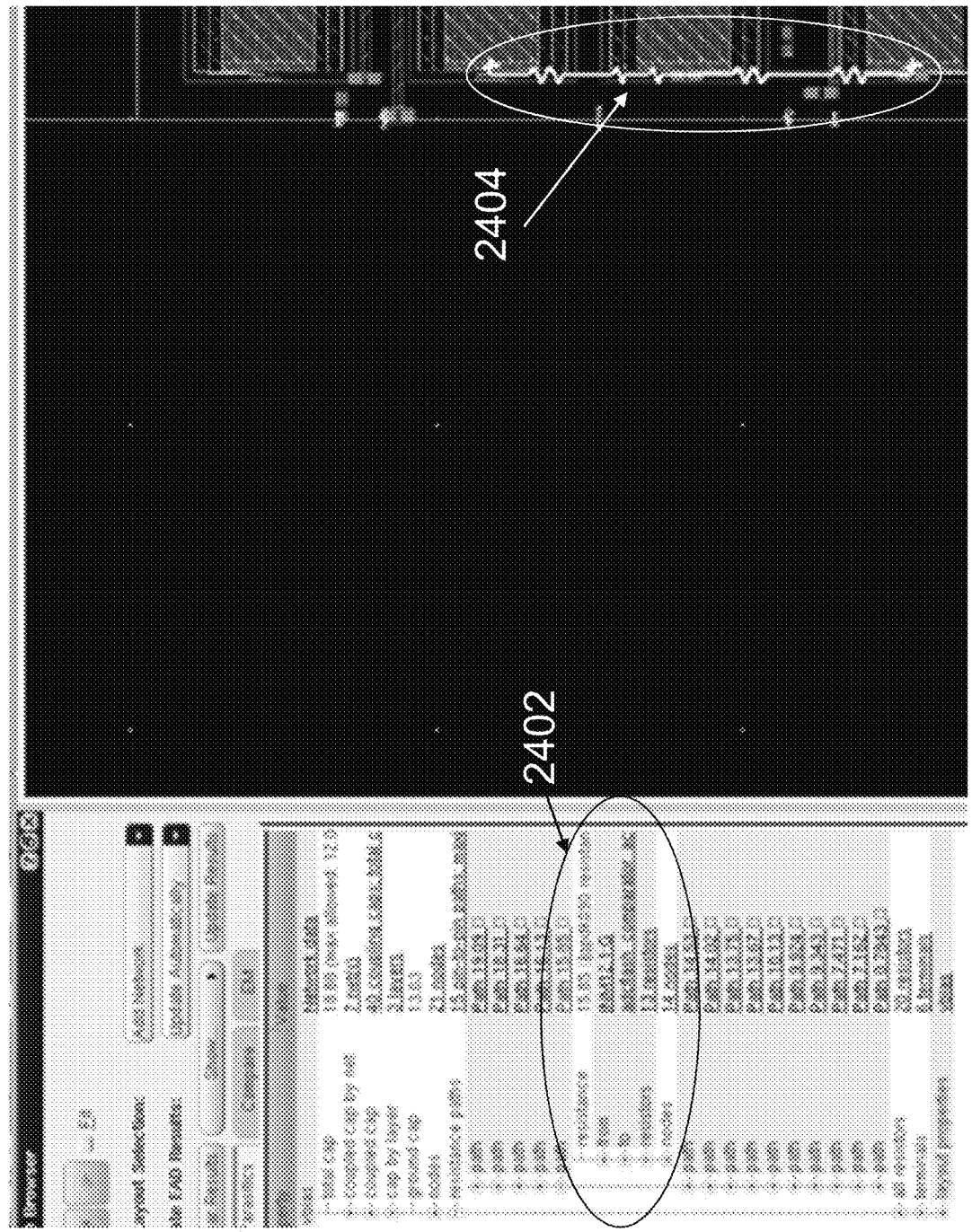

FIG. 24 illustrates the further expanded view of the "resistance paths" item which further comprises a plurality of paths, some or all of which may be further expanded to show additional information or data in some embodiments. In this example, a particular path is identified, expanded, and highlighted in red, for example, in 2402 (color not shown) in the EAD browser to show additional information about this particular path. In this example, the additional information comprises the resistance of the path, the from node and the to node of the path, the number of resistors identified along the path, or the number of nodes identified along the path. In some embodiments, the method or system described herein automatically show a graphical display for the resistance path (2404) in the GUI in response to the identification, expansion, or highlighting of the "resistance path" in the EAD browser (2402). In some embodiments, the method or system described herein automatically identifies, expands, or highlights the corresponding resistance paths in the EAD browser (2402) in response to the identification, expansion, or highlighting of the "resistance path" in the graphical display are (2402) such as a layout editor. It shall be noted that some or all of these additional pieces of information may be further expanded to show even more information or data. The GUI also allows the user to select two pins and then display the total resistance of the selected path.

In this example, the system automatically highlights the component(s) corresponding to the identified path and represents the path with a plurality of resistor symbols located in the vicinity of the locations where these resistors are captured or extracted in response to the identification of the particular path.

Figure 25:
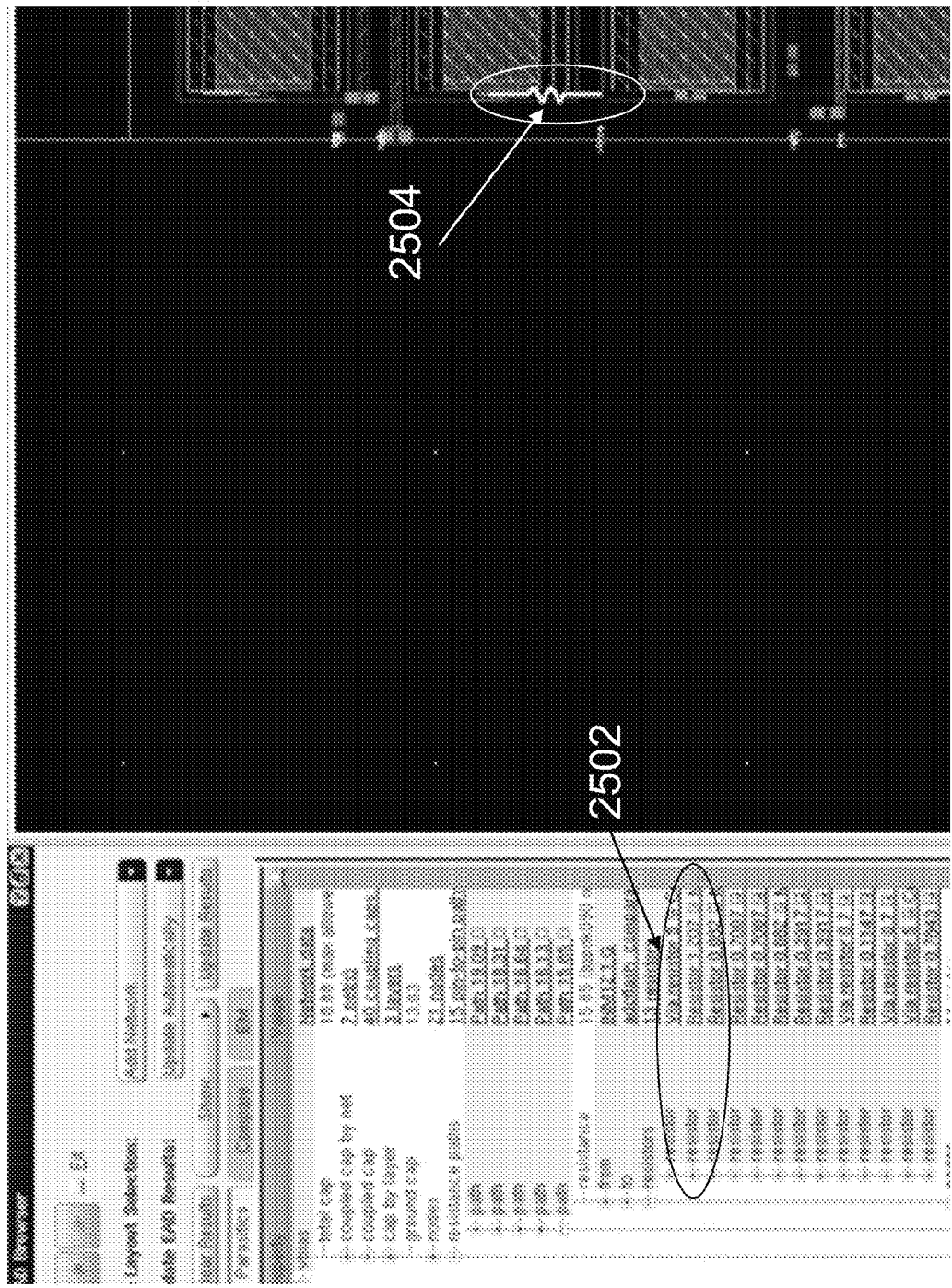

FIG. 25 illustrates the further expanded view of the "resistors" item under a particular "path" item in the "resistance paths" collapsible tree in some embodiments. More specifically, FIG. 25 illustrates that a particular resistor is identified and associated with a resistance of $1.207\Omega$ as shown in 2502, and that in response to the identification of the particular resistor, the system automatically highlights the corresponding component and represents the component with a resistor symbol 2504 in the vicinity of a location where the resistance is captured or extracted in the physical design display portion.

Figure 26:
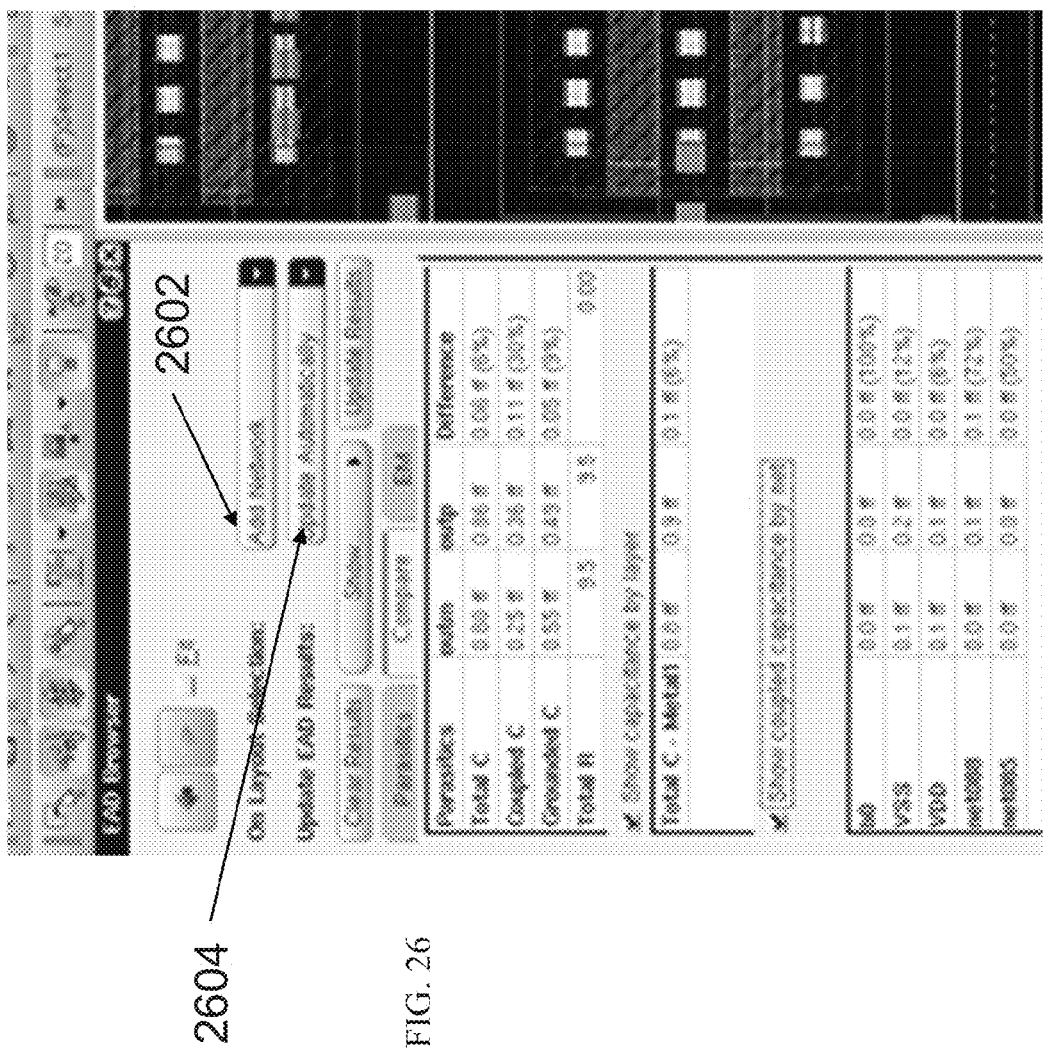

FIG. 26 illustrates the capability of the user interface in displaying parasitics comparison results of a plurality of nets in some embodiments. A user may add nets for comparison by selecting the nets from the "Add Network" pull down menu (2602). The user may also choose whether or not the comparison results are to be updated automatically by selecting the update method from the "Update Automatically" pull down menu (2604) in some embodiments.

Once the nets are identified, the EAD browser displays the parasitics of each net and the comparison results of the corresponding parasitics of the nets. In this example as illustrated in FIG. 26, two nets are identified, and the EAD browser shows the total capacitances of the net "outm" and "outp" and the difference therebetween, the coupled capacitances and the differences, the grounded capacitances and the differences, and the total resistances and the difference. The EAD browser further shows the total capacitance by layer, the coupled capacitance by net, and the respective differences.

Figure 27:
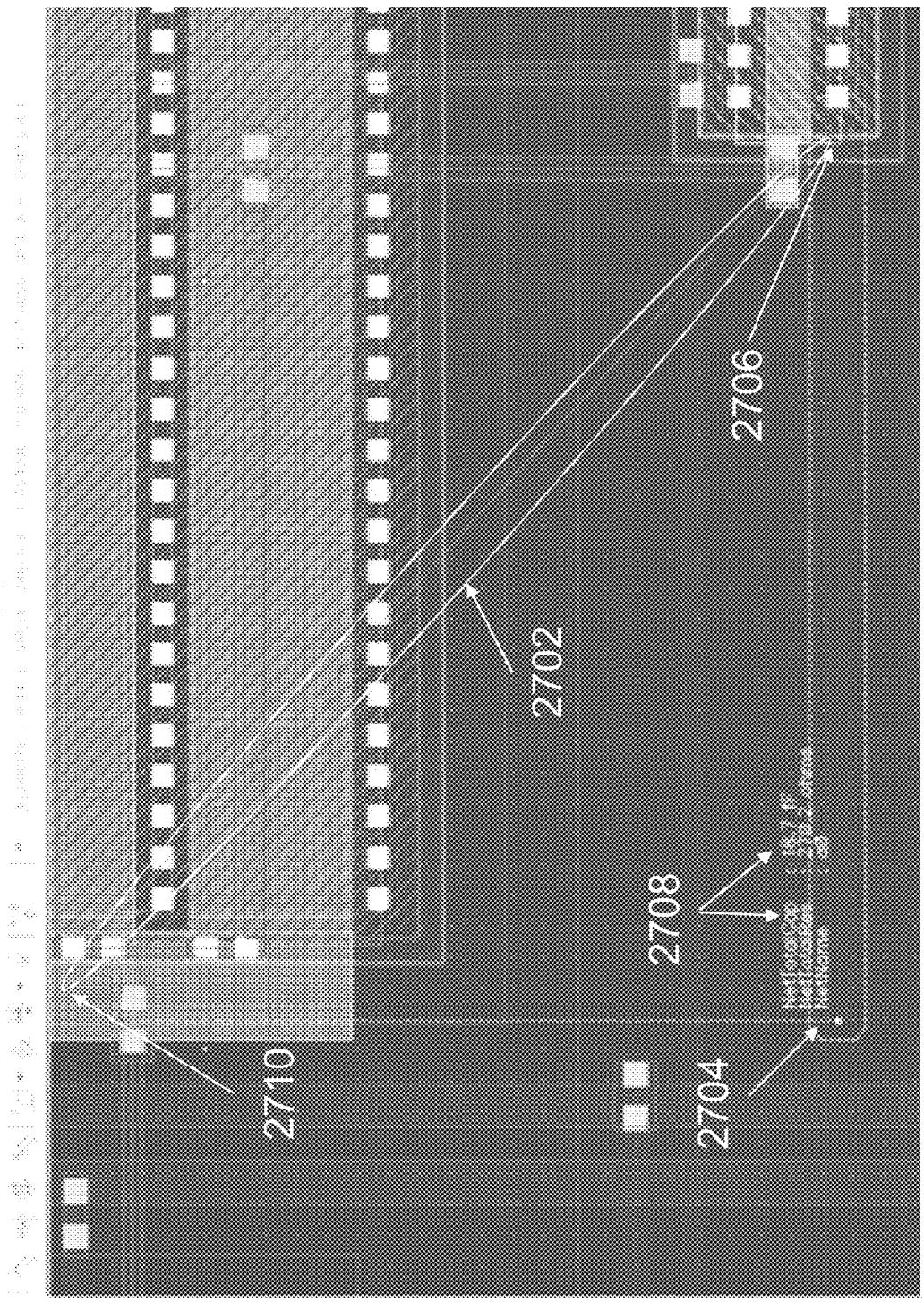

FIG. 27 illustrates the interactive and in situ display of various data or information related to a component in a physical design tool in some embodiments. FIG. 27 illustrates the routing of a net with the GUI providing real-time parasitic updates as the route is manipulated during creation. FIG. 27 illustrates that a user manipulates the a component 2704 by dragging the left end of 2704 in a physical design tool such as a layout editor. FIG. 27 further shows the user interface of the layout editor displays various data or information 2708 in situ and in substantially real-time. In this example, the system generates the balloon information in response to the user's manipulation of the physical design component (for example, dragging the component 2704), and the balloon information 2708 comprises, for example, the total capacitance, the total resistance, and the name of the net to which the component belongs.

Furthermore, in response to the user's manipulation of the component 2704 in the physical design, the system anticipates the end point of the user's modification to the component 2704 and determines and displays a flight line 2702 which starts from the node 2706 and ends at a anticipated end point 2710. In some embodiments, the flight line 2702 varies in response to the user's manipulation of the component 2704. That is, the end point 2710 of the flight line 2702 varies based on how the user modifies the component 2704 by, for example, dragging the component. In addition, as the user is modifying the component, the system automatically characterizes the changing physical data, the associated electrical parasitics, and the associated electrical characteristics, performs various constraint or physical data verification, and displays various information or data in response to the settings of the user interface.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.) assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.) assuming the net terminates with the object that intersects the flight line, for example 2710 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.), compare that characteristic with a limit or constraint, and compute/display the percentage consumed toward the limit or constraint, assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.), compare that characteristic with a limit or constraint, and compute/display the budget or surplus relative to the limit or constraint, assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.), compare that characteristic with a limit or constraint, and compute/display the percentage consumed toward the limit or constraint, assuming the net terminates with the object that intersects the flight line, for example 2710 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS" and filed concurrently under to compute electrical characteristics (voltage(s), current(s), max current capacity, etc.), compare that characteristic with a limit or constraint, and compute/display the budget or surplus relative to the limit or constraint, assuming the net terminates with the object that intersects the flight line, for example 2710 in FIG. 27.

Interactive routing in the aforementioned examples can be achieved through manual, automatic or semi-automated or assisted routing operations. The results of the electrical characteristic comparison may be displayed or may also be used to suggest or automatically modify the physical design to correct the problem.

In some embodiments as illustrated in FIGS. 5-27, all operations are performed, and all information or data are determined and displayed in the same user interface without requiring the user to leave the electronic circuit design tool with which the user interface is associated.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for providing customizable information in designing an electronic circuit with electrical awareness, comprising:
   using at least one processor that is programmed for performing a process comprising:
   displaying a portion of a physical design in a first display portion of an user interface on a display apparatus;
   receiving a manipulation of the portion of the physical design; and
   determining a response to the manipulation by at least predicting how the manipulation affects the physical design before completion of the manipulation and displaying a first part of the response in the first display portion of the user interface and a second part of the response in a browser portion of the user interface.

2. The computer implemented method of claim 1, the process further comprising:
   displaying one or more results relating to an electrical parasitic or an electrical characteristic of the portion of the electrical design or of another element of the physical design that is affected by the manipulation.

3. The computer implemented method of claim 1, in which the act of determining and displaying the response is performed in situ within an electronic circuit physical design tool with which the user interface is integrated.

4. The computer implemented method of claim 1, in which the act of determining and displaying the response is performed without requiring a user to leave the user interface.

5. The computer implemented method of claim 1, in which the response is displayed in substantially real-time in the first display portion.

6. The computer implemented method of claim 1, wherein the act of determining and displaying the response comprises:
grouping a plurality of components in the portion of the physical design or data related the plurality of components into a plurality of groups;
identifying a thermal map with a plurality of visual effects; and
displaying the response by using the thermal map with the plurality of visual effects.

7. The computer implemented method of claim 1, wherein the manipulation comprises changing a characteristic of a component in the physical design.

8. The computer implemented method of claim 1, wherein the manipulation comprises an identification of a component in the portion of the physical design or of a data item related to the component in the first display portion or in another display portion of the user interface.

9. The computer implemented method of claim 1, wherein the response comprises a result of verifying an electrical constraint, an electrical parasitic, an item of physical data of a component in the physical design, or one or more electrical analyses.

10. The computer implemented method of claim 9, wherein the one or more electrical analyses comprise an electro-migration analysis or an IR-drop analysis.

11. The computer implemented method of claim 1, the process further comprising:
determining or displaying a hint in response to the manipulation in the display apparatus, wherein the hint includes at least one of an electrical property of the portion of the physical design and a recommended fix for a violation of a design requirement arising from the manipulation.

12. The computer implemented method of claim 1, in which the process is performed by the at least one processor in situ.

13. The computer implemented method of claim 1, further comprising:
determining or displaying an electrical characteristic relative to interactive manipulation of a physical design object and comparing the characteristic to a limit or constraint.

14. The computer implemented method of claim 1, further comprising:
comparing the characteristic to a limit or constraint; and
determining or displaying a budget or percentage that a particular electrical characteristic has consumed toward a limit or constraint.

15. A system for providing customizable information in designing an electronic circuit with electrical awareness, comprising:
at least one processor that to:
display a portion of a physical design in a first display portion of an user interface on a display apparatus;
receive a manipulation of the portion of the physical design; and
determine a response to the manipulation by at least predicting how the manipulation affects the physical design before completion of the manipulation and displaying a first part of the response in the first display portion of the user interface and a second part of the response in a browser portion of the user interface.

16. The system of claim 15, in which the at least one processor is further to:
display one or more results relating to an electrical parasitic or an electrical characteristic of the portion of the electrical design or of another element of the physical design that is affected by the manipulation.

17. The system of claim 15, in which the at least one processor is further to:
group a plurality of components in the portion of the physical design or data related the plurality of components into a plurality of groups;
identify a thermal map with a plurality of visual effects; and
display the response by using the thermal map with the plurality of visual effects.

18. The system of claim 15, wherein
the response is displayed in substantially real-time in the first display portion;
the manipulation comprises changing a characteristic of a component in the physical design or an identification of a component in the portion of the physical design or of a data item related to the component in the first display portion or in another display portion of the user interface; or
the response comprises a result of verifying an electrical constraint, an electrical parasitic, an item of physical data of a component in the physical design, or one or more electrical analyses.

19. The system of claim 15, in which the at least one processor is further to:
determine or display a hint in response to the manipulation in the display apparatus; or
determine or display an electrical characteristic relative to interactive manipulation of a physical design object and comparing the characteristic to a limit or constraint.

20. The system of claim 15, in which the at least one processor is further to:
determine or display a flight line in response to the manipulation.

21. An article of manufacture comprising a non-transitory computer readable storage medium having stored thereupon a sequence of instructions which, when executed by at least one processor, causes the at least one processor to perform a process for providing customizable information in designing an electronic circuit with electrical awareness, the process comprising:
using the at least one processor that is programmed for performing the process that comprises:
displaying a portion of a physical design in a first display portion of an user interface on a display apparatus;
receiving a manipulation of the portion of the physical design; and
determining a response to the manipulation by at least predicting how the manipulation affects the physical design before completion of the manipulation and displaying a first part of the response in the first display portion of the user interface and a second part of the response in a browser portion of the user interface.

22. The article of manufacture of claim 21, the process further comprising:
displaying one or more results relating to an electrical parasitic or an electrical characteristic of the portion of the electrical design or of another element of the physical design that is affected by the manipulation.

23. The article of manufacture of claim 21, the process further comprising:
grouping a plurality of components in the portion of the physical design or data related the plurality of components into a plurality of groups;
identifying a thermal map with a plurality of visual effects; and
displaying the response by using the thermal map with the plurality of visual effects.

24. The article of manufacture of claim 21, wherein
the response is displayed in substantially real-time in the first display portion;
the manipulation comprises changing a characteristic of a component in the physical design or an identification of a component in the portion of the physical design or of a data item related to the component in the first display portion or in another display portion of the user interface; or
the response comprises a result of verifying an electrical constraint, an electrical parasitic, an item of physical data of a component in the physical design, or one or more electrical analyses.

25. The article of manufacture of claim 21, the process further comprising at least one of:
determining or displaying a hint in response to the manipulation in the display apparatus; and
determining or displaying an electrical characteristic relative to interactive manipulation of a physical design object and comparing the characteristic to a limit or constraint.

26. The article of manufacture of claim 21, in which the process that further comprises at least one of:
determining or displaying a flight line in response to the manipulation in the display apparatus.

* * * * *